(12) United States Patent
Schwab et al.

(10) Patent No.: US 8,537,335 B2
(45) Date of Patent: Sep. 17, 2013

(54) ILLUMINATION SYSTEM FOR A MICROLITHOGRAPHY PROJECTION EXPOSURE APPARATUS, MICROLITHOGRAPHY PROJECTION EXPOSURE APPARATUS COMPRISING SUCH AN ILLUMINATION SYSTEM, AND FOURIER OPTICAL SYSTEM

(75) Inventors: Markus Schwab, Aalen (DE); Michael Layh, Aalen (DE); Markus Deguenther, Aalen (DE); Artur Hoegele, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 420 days.

(21) Appl. No.: 12/917,956

(22) Filed: Nov. 2, 2010

(65) Prior Publication Data

US 2011/0102758 A1    May 5, 2011

Related U.S. Application Data

(63) Continuation of application No. PCT/EP2009/002824, filed on Apr. 17, 2009.

(60) Provisional application No. 61/051,785, filed on May 9, 2008.

(30) Foreign Application Priority Data

May 9, 2008    (DE) .......................... 10 2008 023 763
Jul. 25, 2008    (DE) .......................... 10 2008 035 320

(51) Int. Cl.
*G03B 27/54*    (2006.01)
*G03B 27/42*    (2006.01)

(52) U.S. Cl.
USPC ............................................ 355/67; 355/53

(58) Field of Classification Search
USPC .................................... 355/52, 53, 55, 67–71
See application file for complete search history.

(56) References Cited

U.S. PATENT DOCUMENTS 6,563,556 B2    5/2003    Nikol et al.
7,714,983 B2 *    5/2010    Koehler et al. ................. 355/67
(Continued)

FOREIGN PATENT DOCUMENTS

CN    1879062    12/2006
EP    0 535 564    4/1993
(Continued)

OTHER PUBLICATIONS

Delano, "First order Design and the y-ybar diagram," Applied Optics, vol. 2, No. 12, Dec. 1963.

(Continued)

*Primary Examiner* — Hung Henry Nguyen
(74) *Attorney, Agent, or Firm* — Fish & Richardson P.C.

(57) ABSTRACT

An illumination system for a microlithography projection exposure apparatus for illuminating an illumination field with the light from a primary light source has a variably adjustable pupil shaping unit for receiving light from the primary light source and for generating a variably adjustable two-dimensional intensity distribution in a pupil shaping surface of the illumination system. The pupil shaping unit has a Fourier optical system for converting an entrance beam bundle entering through an entrance plane of the Fourier optical system into an exit beam bundle exiting from an exit plane of the Fourier optical system. The Fourier optical system has a focal length $f_{FOS}$ and a structural length L measured between an entrance-side first system surface and an exit-side last system surface along an optical axis, where $(L/f_{FOS})<1/6$.

26 Claims, 16 Drawing Sheets

(56) References Cited

U.S. PATENT DOCUMENTS

| | | |
|---|---|---|
| 7,864,296 B2 * | 1/2011 | Takahashi et al. ............. 355/71 |
| 2002/0024650 A1 | 2/2002 | Sano |
| 2004/0265707 A1 | 12/2004 | Socha |
| 2007/0024972 A1 * | 2/2007 | Kuerz et al. .................. 359/487 |
| 2007/0165202 A1 | 7/2007 | Koehler et al. |

FOREIGN PATENT DOCUMENTS

| | | |
|---|---|---|
| EP | 1 522 893 | 4/2005 |
| JP | 2000-106339 | 4/2000 |
| WO | WO 2005/026843 | 3/2005 |

OTHER PUBLICATIONS

The International Search Report and a Written Opinion from the counterpart PCT Application No. PCT/EP2009/002824, mailed Aug. 20, 2009.

Chinese Office, with English translation, for corresponding CN Appl No. 200980125981.X, dated Sep. 19, 2012.

* cited by examiner

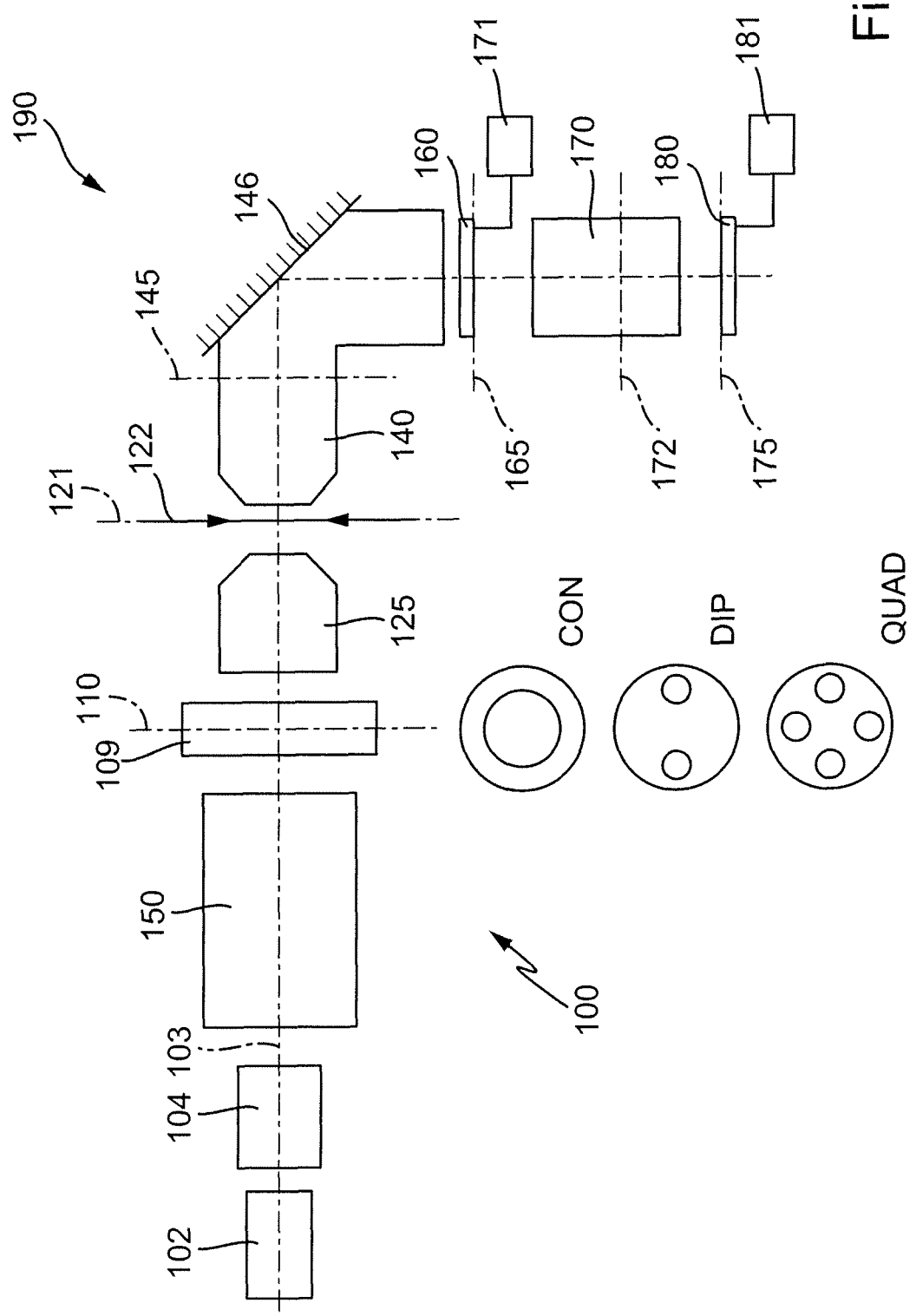

Fig. 7A
Fig. 8
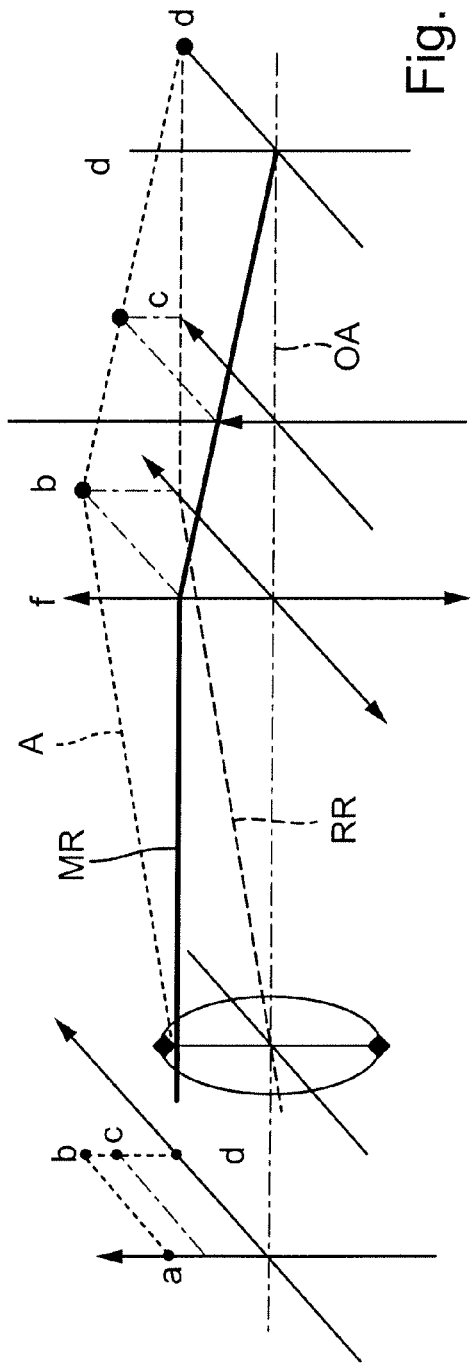
Fig. 7B

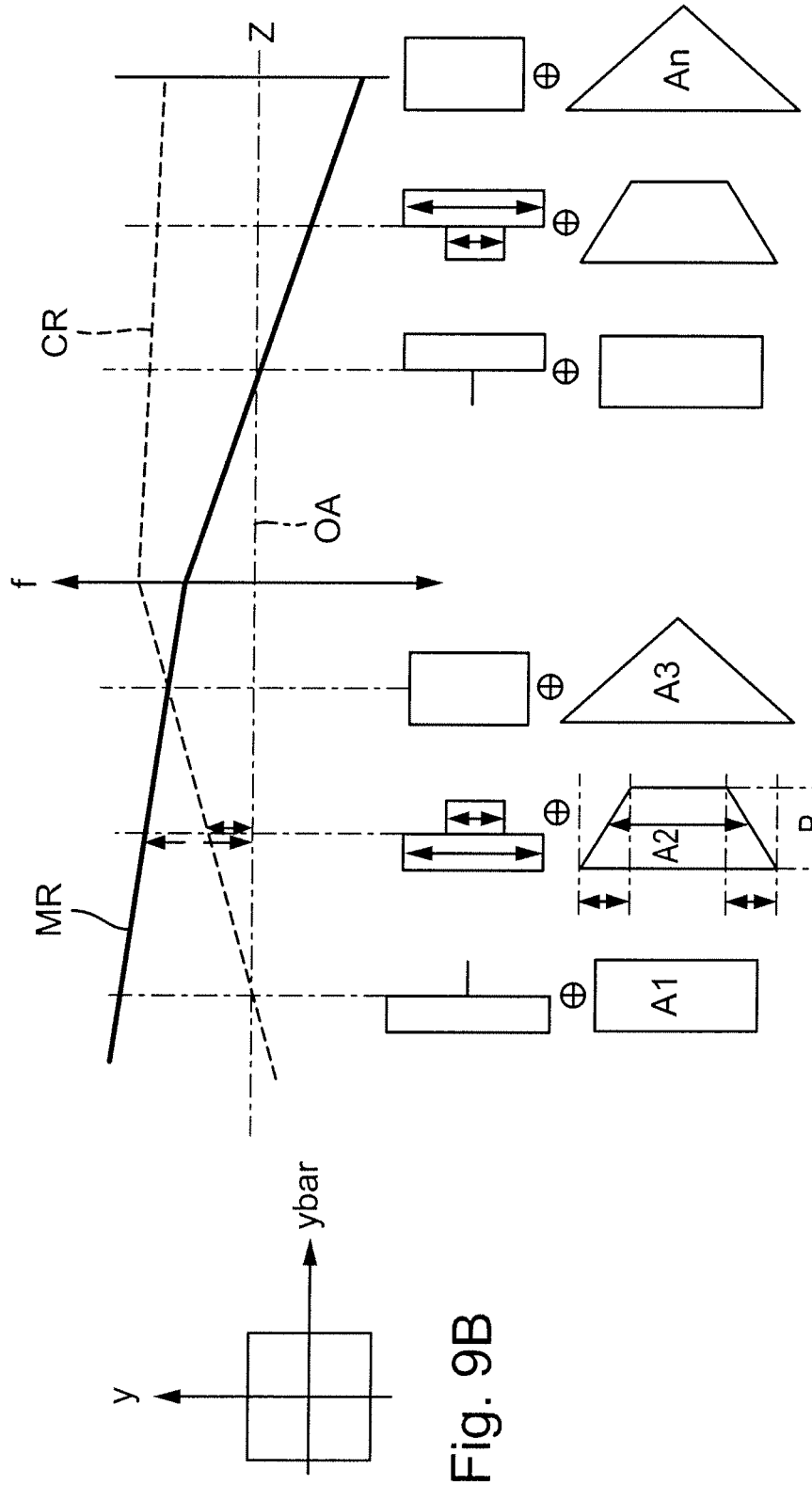

ILLUMINATION SYSTEM FOR A MICROLITHOGRAPHY PROJECTION EXPOSURE APPARATUS, MICROLITHOGRAPHY PROJECTION EXPOSURE APPARATUS COMPRISING SUCH AN ILLUMINATION SYSTEM, AND FOURIER OPTICAL SYSTEM

CROSS-REFERENCE TO RELATED APPLICATIONS

This application is a continuation of, and claims benefit under 35 USC 120 to, international application PCT/EP2009/002824, filed Apr. 17, 2009, which claims benefit of German Application No. 10 2008 035 320.5, filed Jul. 25, 2008; German Application No. 10 2008 023 763.9, filed May 9, 2008 and U.S. Ser. No. 61/051,785, filed May 9, 2008. International application PCT/EP2009/002824 is hereby incorporated by reference in its entirety.

FIELD

The disclosure relates to an illumination system for a microlithography projection exposure apparatus for illuminating an illumination field with the light from a primary light source, and to a microlithography projection exposure apparatus including such an illumination system. Furthermore, the disclosure relates to a Fourier optical system which can be used, for example, as part of an illumination system of a microlithography projection exposure apparatus.

BACKGROUND

Microlithographic projection exposure methods are predominantly used nowadays for producing semiconductor components and other finely structured components. This involves using a mask (reticle) that carries the pattern of a structure to be imaged, for example a line pattern of a layer of a semiconductor component. A mask is positioned into a projection exposure apparatus between illumination system and projection objective in the region of the object surface of the projection objective and illuminated with an illumination radiation provided by the illumination system. The radiation altered by the mask and the pattern passes as projection radiation through the projection objective, which images the pattern of the mask onto the substrate to be exposed, which normally carries a radiation-sensitive layer (photoresist).

In the case of projection microlithography, the mask is illuminated with the aid of an illumination system, which shapes from the light from a primary light source, such as a laser, illumination radiation that is directed onto the mask and is defined by specific illumination parameters. The illumination radiation impinges on the mask within an illumination field (area of defined shape and size, for example, rectangular field or curved ring field), wherein the shape and size of the illumination field are generally constant (not variable). An intensity distribution that is as uniform as possible is generally sought within the illumination field, for which purpose homogenizing devices, for example, light mixing elements such as fly's eye condensers and/or rod integrators, can be provided within the illumination system.

Moreover, depending on the type of structures to be imaged, different illumination modes (so-called "illumination settings") are often involved, which can be characterized by different local intensity distributions of the illumination radiation in a pupil surface of the illumination system. In this context, this is sometimes called "structured illumination" or "structuring of the illumination pupil" or structuring of the secondary light source. The pupil surface of the illumination system in which specific, definable two-dimensional intensity distributions (the secondary light sources) are intended to be present is also referred to in this application as "pupil shaping surface", since essential properties of the illumination radiation are generally "shaped" with the aid of this intensity distribution. The illumination settings include, for example, in the case of the conventional illumination settings, round illumination spots centered around the optical axis of the illumination system and having different diameters (generally defined by the degree of coherence σ of the illumination) and, in the case of non-conventional, i.e. abaxial types of illumination, ring illumination (or annular illumination) and also polar intensity distributions, for example dipole illumination or quadrupole illumination. The non-conventional illumination settings for generating an abaxial (oblique) illumination may serve, among other things, to increase the depth of focus by two-beam interference and to increase the resolution.

In the case of an illumination system incorporated into a microlithography projection exposure apparatus, the "pupil shaping surface" of the illumination system, in which the desired two-dimensional intensity distribution (secondary light source) is intended to be present, can be situated at or near a position which is optically conjugate with respect to a pupil plane of a downstream projection objective. In general, the pupil shaping surface can correspond to a pupil surface of the illumination system or lie in the vicinity thereof. Provided that the intervening optical components do not change the ray angle distribution, that is to say operate in angle-maintaining fashion, the angle distribution of the illumination radiation impinging on the pattern of the mask is determined by the spatial intensity distribution in the pupil shaping surface of the illumination system. Moreover, provided that the intervening optical components operate in angle-maintaining fashion, the spatial intensity distribution in the pupil of the projection objective is determined by the spatial intensity distribution (spatial distribution) in the pupil shaping surface of the illumination system.

Those optical components and assemblies of the illumination system which are provided for receiving light from a primary light source, for example a laser or a mercury vapor lamp, and for generating therefrom a desired two-dimensional intensity distribution (secondary light source) in the "pupil shaping surface" of the illumination system jointly form a pupil shaping unit, which should generally be variably adjustable.

US 2007/0165202 A1 (corresponding to WO 2005/026843 A2) in the name of the applicant discloses illumination systems in which a pupil shaping unit for receiving light from a primary light source and for generating a variably adjustable two-dimensional intensity distribution in a pupil shaping surface of the illumination system includes a multimirror array (MMA) with individually drivable individual mirrors that can alter the angle distribution of the radiation incident on the mirror elements in a targeted manner such that the desired illumination intensity distribution results in the pupil shaping surface.

Methods for calculating optimum structurings of the intensity distribution in the pupil shaping surface of an illumination system in a manner dependent on mask structures to be imaged are disclosed for example in U.S. Pat. No. 6,563,556 or US 2004/0265707.

SUMMARY

The disclosure provides an illumination system for a microlithography projection exposure apparatus which makes it possible to rapidly change between different illumination modes.

The disclosure provides a compact light mixing system which is suitable for integration into an illumination system for a microlithography projection exposure apparatus and which is able to effect light mixing in the case of a small geometrical flux substantially without the introduction of geometrical flux.

In some embodiments, the disclosure provides an illumination system for a microlithography projection exposure apparatus for illuminating an illumination field with the light from a primary light source. The illumination system includes a variably adjustable pupil shaping unit for receiving light from the primary light source and for generating a variably adjustable two-dimensional intensity distribution in a pupil shaping surface of the illumination system. The pupil shaping unit has a Fourier optical system for converting an entrance beam bundle entering through an entrance plane of the Fourier optical system into an exit beam bundle exiting from an exit plane of the Fourier optical system. The Fourier optical system has a focal length $f_{FOS}$ and a structural length L measured between an entrance-side first system surface and an exit-side last system surface along an optical axis, and the condition $(L/f_{FOS}) < 1/6$ holds true.

In certain embodiments, the disclosure provides a Fourier optical system for converting an entrance beam bundle entering through an entrance plane of the Fourier optical system into an exit beam bundle exiting from an exit plane of the Fourier optical system. The Fourier optical system has a focal length $f_{FOS}$ and a structural length L measured between an entrance-side first system surface and an exit-side last system surface along an optical axis, and the condition $(L/f_{FOS}) < 1/6$ holds true.

In some embodiments, the disclosure provides a light mixing system for receiving light from a primary light source and for generating a substantially homogeneous two-dimensional intensity distribution in an illumination surface. The light mixing system has a Fourier optical system as described herein a light mixing device that is effective in the angle domain is disposed upstream of the Fourier optical system.

In certain embodiments, the disclosure provides a microlithography projection exposure apparatus for exposing a radiation-sensitive substrate arranged in the region of an image surface of a projection objective with at least one image of a mask pattern arranged in the region of an object surface of the projection objective. The apparatus includes a primary light source; an illumination system for receiving the light from the primary light source and for shaping illumination radiation directed onto the pattern of the mask; and a projection objective for imaging the structure of the mask onto a light-sensitive substrate. The illumination system is constructed in a manner described herein.

The expression "Fourier optical system", as used herein, denotes an optical system which transforms a radiation power distribution present in the entrance plane of the Fourier optical system into the exit plane whilst maintaining a geometrical flux (etendue) of the radiation passing through. In this case, the exit plane is a plane Fourier-transformed with respect to the entrance plane. In this case, a beam bundle passing through defines in the entrance plane an entrance surface of specific shape and size, for example a circular entrance surface or an entrance surface that is square or rectangular in some other way. In the Fourier-transformed exit plane, the beam bundle defines an exit surface whose shape and size are determined by the angle distribution of the radiation in the entrance plane. In this case, the geometry of the entrance surface is defined by the ray heights of the rays passing through. The geometry of the entrance surface is converted into a corresponding angle distribution (distribution of ray angles) in the exit plane by the Fourier optical system. The "entrance surface" and the "exit surface" are defined here as the areas of intersection of a beam bundle passing through with the entrance plane and the exit plane, respectively, and therefore each contain a specific surface area. During the Fourier transformation that takes place between entrance plane and exit plane, the power distribution of each individual surface element in the entrance surface over the entire exit surface is distributed over the exit surface in accordance with the local divergence. In this case, all the surface elements which are received on the exit side are additively superimposed in at least one dimension.

A beam bundle within a real optical system contains a multiplicity of rays having different propagation directions. The angle distribution of the rays of a beam bundle can be described by the divergence DIV of the beam bundle, which describes the largest angle difference between rays within the beam bundle. As an alternative, it is also possible to provide a description by the numerical aperture NA of the beam bundle, which in this application corresponds to the sine of half the divergence angle. In paraxial optics, that is to say in the case of small ray angles relative to the optical axis of an optical system, the numerical aperture NA thus corresponds to half the divergence, that is to say that NA=DIV/2. The effect of a Fourier optical system on a beam bundle passing through with a given input divergence (divergence on the entrance side) can be described in simplified fashion such that each ray angle $RA_E$ of a ray on the input side is assigned a ray height $RH_A$ proportional to the ray angle on the exit side. The ray height is defined here as the perpendicular distance of a ray at a given axial location with respect to the optical axis. The proportionality between the ray angles on the entrance side and the ray heights on the exit side is given by the focal length $f_{FOS}$ of the Fourier optical system in accordance with $RH_A = f_{FOS} * \sin(RA_E)$.

Since a Fourier optical system accordingly converts ray angles on its entrance side into ray heights on its exit side according to the focal length of the Fourier optical system, a Fourier optical system having a large focal length is, for example, able to shape from an input beam bundle having a given small input divergence an exit beam bundle having correspondingly larger cross-sectional area, wherein, for a given focal length of the Fourier optical system, the size relationship between entrance surface and exit surface is dependent on the input divergence and is smaller, the larger the input divergence.

In an illumination system which operates with a laser as primary light source, according to the spatial coherence of the laser radiation, generally primary radiation is present with very small divergence in beam bundles having a relatively small beam cross section. On the other hand, in illumination systems there it is often desired to have within the illumination system at least one region in which the radiation passing through has a relatively large beam cross section. If, in the region of large beam cross section, for example, a light modulation device is used in order to variably adjust the angle distribution of the radiation present within an impinging beam bundle, then the spatial resolution of the variable adjustment can be improved if the light modulation device is situated in a region having a relatively large beam diameter and contains an array having many individually drivable individual elements which each influence a partial beam of the impinging beam bundle in angle-altering fashion. The larger the beam diameter at the location of the light modulation device, the simpler it is to provide a sufficiently large number of controllable individual elements of the light modulation device in order to enable a high spatial resolution of the angle adjustment.

A Fourier optical system having a relatively large focal length can be used to generate a beam having a relatively large beam cross section despite relatively small divergence of an entering beam bundle. On the other hand, in an illumination system, structural space for optical subsystems of a pupil shaping unit is generally available only to a limited extent. Through the use of a Fourier optical system according to the disclosure, it is possible to reconcile the conflicting demands for effective beam expansion of an input beam bundle with small divergence, on the one hand, and relatively small structural space properties, on the other hand.

In some embodiments, for the telefactor TF=$L/f_{FOS}$ the condition $(L/f_{FOS})<0.166$ holds true. The telefactor can be, for example, 0.125 or less, or 0.1 or less, or 0.075 or less.

In some embodiments, the focal length $f_{FOS}$ of the Fourier optical system is 10 m or more (e.g., 15 m or more, or 20 m or more, or 50 m or more), and the structural length L is less than 4 m (e.g., 3.5 m or less, or 3 m or less).

The Fourier optical system causes an odd number of Fourier transformations and can cause, for example, 3 or 5 Fourier transformations. In some embodiments, only a single Fourier transformation takes place between entrance surface and exit surface, whereby a short structural length is fostered.

A Fourier optical system having a relatively short structural length in comparison with the focal length generally has at least three lenses. In some embodiments, the Fourier optical system includes a first lens group having an entrance-side first lens and an exit-side second lens and also a second lens group disposed downstream of the first lens group and having an entrance-side first lens and an exit-side second lens, wherein there is a group distance $d_G$ between an exit-side last system surface of the first lens group and an entrance-side first system surface of the second lens group. In this configuration, therefore, at least four lenses are provided. Individual lenses can be involved; one or more of the lenses can also be configured as divided lens or lens group. The group distance is generally greater than the structural lengths of the first and the second lens group.

In some embodiments, for the group distance $d_G$, the condition $d_G>0.60*L$ holds true. The group distance can therefore make up a significant proportion of the total structural length L. The condition $d_G>0.65*L$ or $d_G>0.7*L$ can also hold true. The mutually facing lenses of the first and second lens group should therefore be at a relatively large distance, which is advantageous, for example, with regard to the energetic loading of these lenses.

The group distance can be relatively small in comparison with the focal length. In some exemplary embodiments, the condition $d_G<0.12*f_{FOS}$ holds true. In particular, $d_G<0.10*f_{FOS}$ or $d_G<0.08*f_{FOS}$ or $d_G<0.06*f_{FOS}$ can hold true.

Construction principles for the construction of a Fourier optical system optimized with regard to the radiation loading of the lens elements are explained thoroughly in connection with the exemplary embodiments.

If the Fourier optical system is designed for transferring a radiation energy E per unit time given a geometrical flux H, $P_A$ is a predeterminable maximum energetic loading of the exit-side second lens of the first lens group and $P_B$ is a predeterminable maximum energetic loading of the entrance-side first lens of the second lens group, then in some exemplary embodiments it is provided that a group distance $d_G$ between an exit-side last system surface of the first lens group and an entrance-side first system surface of the second lens group is not less than a minimum group distance $d_G^{min}$, wherein the following holds true for the minimum group distance:

$$d_G^{min}=n/H*E/(P_aP_b)^{1/2}$$

If this condition is met, what can be achieved is that the lenses that are particularly jeopardized by radiation loading are not loaded excessively, with the result that continuous operation without lens degradation is possible.

In order, on the other hand, to keep the total structural length L moderate, it can be provided that the group distance $d_G$ lies between $d_G^{min}$ and $3*d_G^{min}$.

In some embodiments, the pupil shaping unit has a light mixing device disposed upstream of the Fourier optical system. This light mixing device is therefore arranged between the primary light source and the Fourier optical system. If the light mixing device mixes the entering radiation in such a way that there is a substantially homogeneous distribution in the angle domain, then this distribution is converted, by the Fourier optical system disposed downstream, into a homogeneous light distribution in the space domain in the region of the exit surface, that is to say into a largely uniform illumination of the exit surface. The light mixing device can include at least one fly's eye condenser. The latter's back focal plane facing the Fourier optical system can substantially coincide with the entrance surface of the Fourier optical system or be slightly displaced relative to the surface. Through the combination of a light mixing device having a homogenizing effect in the angle domain with a Fourier optical system disposed downstream, it is possible to mix or to homogenize input light having relatively low geometrical flux, for example the light from a laser beam, substantially without introduction of geometric flux.

In one variant, the Fourier optical system has at least one pair of crossed cylindrical lens systems, wherein one pair of crossed cylindrical lens systems has a first cylindrical lens system having at least one first cylindrical surface curved in a first curvature plane and a second cylindrical lens system having at least one second cylindrical surface curved in a second curvature surface, wherein the first and the second curvature plane are perpendicular to one another. Under certain loading conditions, the structural length of a loading-optimized Fourier optical system can be smaller with the use of crossed cylindrical lens systems than with the use of rotationally symmetrical lenses.

Cylindrical lenses having differently oriented curvature planes can be interleaved, that is to say arranged in an alternating sequence. It is also possible to group the differently oriented cylindrical lenses into "pure" subsystems. In one variant, the Fourier optical system has a first cylindrical lens group having a plurality of first cylindrical lenses and, disposed downstream, a second cylindrical lens group having a plurality of second cylindrical lenses with orthogonal orientation of the curvature plane.

The disclosure also relates to a Fourier optical system for converting an entrance beam bundle entering through an entrance plane of the Fourier optical system into an exit beam bundle exiting from an exit plane of the Fourier optical system, wherein the Fourier optical system has a focal length $f_{FOS}$ and a structural length L measured between an entrance-side first system surface and an exit-side last system surface along an optical axis and the condition $(L/f_{FOS})<1/6$ holds true.

The Fourier optical system can be used in an illumination system of a projection exposure apparatus for microlithography as described or elsewhere. As an alternative, it can also be used in other radiation-guiding systems, for example, in a laser processing machine.

The disclosure also relates to a light mixing system for receiving light from a primary light source and for generating a substantially homogeneous two-dimensional intensity distribution in an illumination surface, wherein the light mixing system has a Fourier optical system of the type mentioned and a light mixing device that is effective in the angle domain is disposed upstream of the Fourier optical system. A compact light mixing system having a moderate desired structural space property can thereby be provided, which is able to bring about light mixing in the case of a small geometrical flux substantially without introduction of geometrical flux.

The disclosure also relates to a microlithography projection exposure apparatus for exposing a radiation-sensitive substrate arranged in the region of an image surface of a projection objective with at least one image of a mask pattern arranged in the region of an object surface of the projection objective, including: a primary light source; an illumination system for receiving the light from the primary light source and for shaping illumination radiation directed onto the pattern of the mask; and a projection objective for imaging the structure of the mask onto a light-sensitive substrate, wherein the illumination system contains at least one Fourier optical system of the type described in this application.

The expressions "radiation", and "light" within the meaning of this application should be interpreted broadly and are intended to encompass in particular electromagnetic radiation from the deep ultraviolet range, for example at wavelengths of approximately 365 nm, 248 nm, 193 nm, 157 nm or 126 nm.

The above and further features are apparent not only from the claims but also from the description and the drawings, wherein the individual features can be realized in each case by themselves or as a plurality in the form of subcombinations in embodiments of the disclosure and in other fields and can represent advantageous and inherently protectable embodiments.

BRIEF DESCRIPTION OF THE DRAWINGS

FIG. 1 shows a schematic overview of a microlithography projection exposure apparatus with a pupil shaping unit;

FIG. 2 schematically shows essential components of an embodiment of a pupil shaping unit, wherein

FIGS. 7A-7B schematically show the illustration of a paraxial ray path through an optical system and the associated Delano diagram;

FIG. 8 shows an illustration of a distance D between two points in the Delano diagram;

FIGS. 9A-B illustrate an energetic loading model for optical elements of an optical system and the associated Delano diagram;

DETAILED DESCRIPTION

Figure 2A:
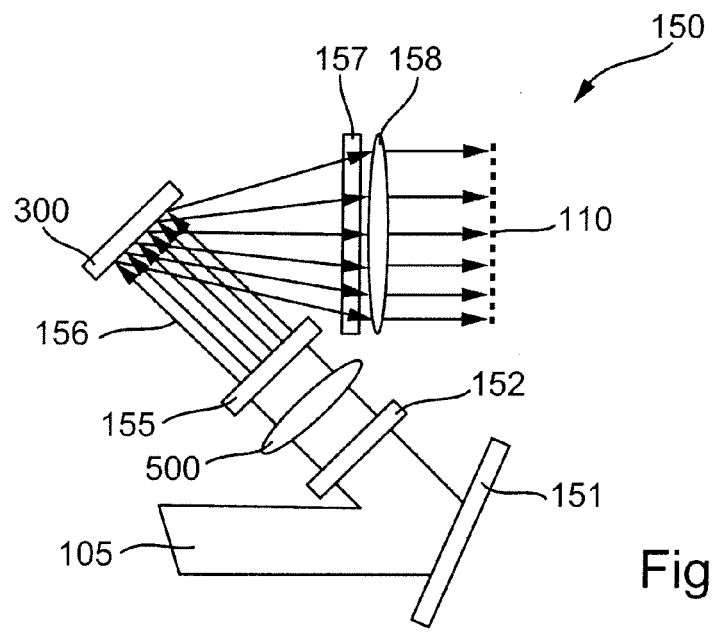
FIG. 2A is an overview illustration and FIGS. 2B, 2C schematically show a multimirror array used in the pupil shaping unit.

FIG. 1 shows an example of a microlithography projection exposure apparatus 100 which can be used in the production of semiconductor components and other finely structured components and operates with light or electromagnetic radiation from the deep ultraviolet range (DUV) in order to obtain resolutions down to fractions of micrometers. An ArF-excimer laser having an operating wavelength of approximately 193 nm serves as a primary light source 102, the linearly polarized laser beam of the laser being coupled into the illumination system coaxially with respect to the optical axis 103 of the illumination system 190. Other UV light sources, for example $F_2$ lasers having an operating wavelength of 157 nm, ArF-excimer lasers having an operating wavelength of 248 nm, or mercury vapor lamps, for example, having an operating wavelength of 368 nm or 436 nm, and primary light sources having wavelengths of less than 157 nm, are likewise possible.

The polarized light from the light source 102 firstly enters into a beam expander 104, which can be embodied for example as a mirror array in accordance with U.S. Pat. No. 5,343,489 and serves for reducing the coherence of and enlarging the beam cross section.

The expanded laser beam has a specific cross-sectional area containing an area for example within the range of between 100 mm² and 1000 mm² and a specific cross-sectional shape, for example a square cross-sectional shape. The divergence of the expanded laser beam is generally less than the very small divergence of the laser beam prior to the beam expansion. The divergence can be, for example, between approximately 1 mrad and approximately 3 mrad.

The expanded laser beam enters into a pupil shaping unit 150, which contains a multiplicity of optical components and groups and is designed to generate in a downstream pupil shaping surface 110 of the illumination system 190 a defined, local (two-dimensional) illumination intensity distribution, which is sometimes also referred to as a secondary light source or as an "illumination pupil". The pupil shaping surface 110 is a pupil surface of the illumination system.

The pupil shaping unit 150 is variably adjustable, such that different local illumination intensity distributions (that is to say differently structured secondary light sources) can be set depending on the driving of the pupil shaping unit. FIG. 1 schematically shows various illuminations of the circular illumination pupil by way of example, namely a conventional setting CON with a centered, circular illumination spot, a dipole illumination DIP or a quadrupole illumination QUAD.

Arranged in direct proximity to the pupil shaping surface 110 is an optical raster element 109. A coupling-in optical unit 125 arranged downstream of the latter transmits the light onto an intermediate field plane 121, in which a reticle/masking system (REMA) 122 is arranged, which serves as an adjustable field diaphragm.

The optical raster element 109 has a two-dimensional arrangement of diffractive or refractive optical elements and has a plurality of functions. Firstly, the raster element shapes the entering radiation in such a way that it illuminates a rectangular illumination field after passing through the downstream coupling-in optical unit 125 in the region of the field plane 121. The raster element 109—also referred to as a field-defining element (FDE)—having a rectangular emission characteristic in this case generates the main proportion of the geometrical flux and adapts it to the desired field size and field shape in the field plane 121, which is optically conjugate with respect to the mask plane 165. The raster element 109 can be embodied as a prism array in which individual prisms arranged in a two-dimensional array introduce locally specific angles in order to illuminate the field plane 121 as desired. The Fourier transformation generated by the coupling-in optical unit 125 has the effect that each specific angle at the exit of the raster element corresponds to a location in the field plane 121, while the location of the raster element, that is to say its position with respect to the optical axis 103, determines the illumination angle in the field plane 121. The beam bundles emerging from the individual raster elements are in this case superimposed in the field plane 121. It is also possible to configure the field-defining element in the manner of a multistage fly's eye condenser with microcylindrical lenses and diffusing screens. What can be achieved by a suitable design of the raster element 109 or of its individual elements is that the rectangular field in field plane 121 is illuminated substantially homogeneously. The raster layer 109 therefore serves, as field shaping and homogenizing element, also for homogenizing the field illumination, with the result that a separate light mixing element, for example an integrator rod acting via multiple internal reflection, or a fly's eye condenser can be dispensed with. As a result of this, the optical construction becomes particularly compact axially in this region.

The downstream imaging objective 140 (also called REMA objective) images the intermediate field plane 121 with the field diaphragm 122 onto the reticle 160 (mask, lithography original) on a scale which can lie between 2:1 and 1:5, for example, and is approximately 1:1 in the embodiment. The imaging is effected without an intermediate image, such that precisely one pupil surface 145, which is a Fourier-transformed surface with respect to the exit plane 165 of the illumination system, lies between the intermediate field plane 121, which corresponds to the object plane of the imaging objective 140, and the image plane 165 of the imaging objective, which plane is optically conjugate with respect to the object plane and corresponds to the exit plane of the illumination system and at the same time to the object plane of a downstream projection objective 170. In other embodiments, at least one intermediate image is generated in the imaging objective. A deflection mirror 146 arranged between the pupil surface 145 and the image surface and inclined by 45° with respect to the optical axis 103 makes it possible to incorporate the relatively large illumination system (a number of meters in length) horizontally, and to mount the reticle 160 horizontally. Radiation-influencing elements, for example polarization-influencing elements for setting a defined polarization state of the illumination radiation, can be arranged between the intermediate field plane 121 and the image plane 165 of the imaging objective.

Those optical components which receive the light from the laser 102 and shape from the light illumination radiation that is directed onto the reticle 160 belong to the illumination system 190 of the projection exposure apparatus. Arranged downstream of the illumination system is a device 171 for holding and manipulating the reticle 160 in such a way that the pattern arranged on the reticle lies in the object plane 165 of the projection objective 170 and can be moved in this plane for scanner operation in a scan direction (y direction) perpendicular to the optical axis 103 (z direction) with the aid of a scan drive.

Downstream of the reticle plane 165 there follows the projection objective 170, which acts as a reducing objective and images an image of the pattern arranged on the mask 160 on a reduced scale, for example on a scale of 1:4 or 1:5, onto a wafer 180 coated with a photoresist layer, the light-sensitive surface of the wafer lying in the image plane 175 of the projection objective 170. Refractive, catadioptric or catoptric projection objectives are possible. Other reducing scales, for example greater reductions of up to 1:20 or 1:200, are possible.

The substrate to be exposed, which is a semiconductor wafer 180 in the case of the example, is held by a device 181 including a scanner drive in order to move the wafer synchronously with the reticle 160 perpendicular to the optical axis. Depending on the design of the projection objective 170 (e.g., refractive, catadioptric or catoptric, without intermediate image or with intermediate image, folded or unfolded), these movements can be effected in a manner parallel or antiparallel with respect to one another. The device 181, which is also referred to as a "wafer stage" and the device 171, which is also referred to as a "reticle stage", are part of a scanner device controlled via a scan control device.

The pupil shaping surface 110 lies at or near a position which is optically conjugate with respect to the nearest downstream pupil surface 145 and to the image-side pupil surface 172 of the projection objective 170. Consequently, the spatial (local) light distribution in the pupil 172 of the projection objective is determined by the spatial light distribution (spatial distribution) in the pupil shaping surface 110 of the illumination system. Between the pupil surfaces 110, 145, 172, field surfaces which are Fourier-transformed surfaces relative to the respective pupil surfaces respectively lie in the optical beam path. This means, in particular, that a defined spatial distribution of illumination intensity in the pupil shaping surface 110 produces a specific angle distribution of the illumination radiation in the region of the downstream field surface 121, which in turn corresponds to a specific angle distribution of the illumination radiation incident on the reticle 160.

Figure 2B:
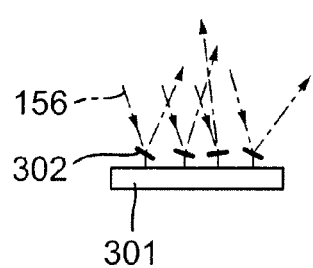
Figure 2C:
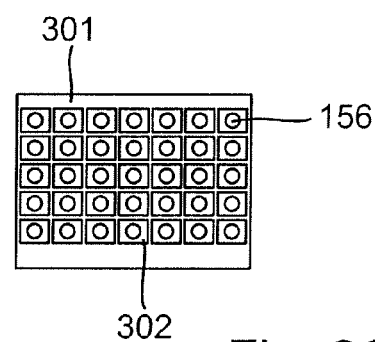

FIG. 2 schematically shows essential components of an embodiment of a pupil shaping unit 150. The entering, expanded laser radiation bundle 105 is deflected by a plane deflection mirror 151 in the direction of a fly's eye condenser (fly eyes lens) 152, which decomposes the arriving radiation bundle into partial illumination beam bundles, which are subsequently transmitted by a Fourier optical system 500 onto a lens array 155, that is to say onto a two-dimensional array arrangement of lens systems. The lens array 155 concentrates the partial illumination beam bundles 156 onto individually drivable mirror elements of a multimirror array 300 (MMA), which will be explained in greater detail in connection with FIGS. 2B and 2C. Here the multimirror array is operated as a reflective light modulation device for controllably altering the angle distribution of the radiation bundle incident on the light modulation device and, by virtue of the orientation of its individual mirrors 102, provides for an illumination angle distribution which can be defined with the aid of the multimirror array and which is superimposed in the pupil shaping surface 110 to form an intensity distribution in this pupil surface. The individual mirrors 302 of the multimirror array, which are fitted on a common carrier element 301, can be tilted about one or more axes for altering the propagation angle of the impinging partial illumination beam bundles 156. The partial illumination beam bundles issuing from the individual mirrors 302 are passed through a diffusing screen 157 and imaged into the pupil shaping surface 110 via a downstream condenser optical unit 158. The lens array 155 and/or the micromirror array 300 can essentially be constructed in the manner described in US 2007/0165202 A1 in the name of the applicant. The disclosure of this patent application in this regard is incorporated by reference in the content of this description. Transmissive light modulation devices are also possible.

Figure 3A:
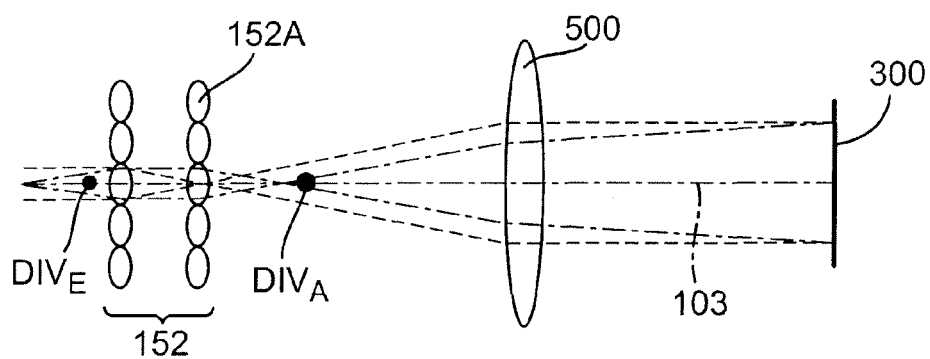
FIG. 3 shows in 3A and 3B a light mixing system with a fly's eye condenser and a Fourier optical system disposed downstream.
Figure 3B:
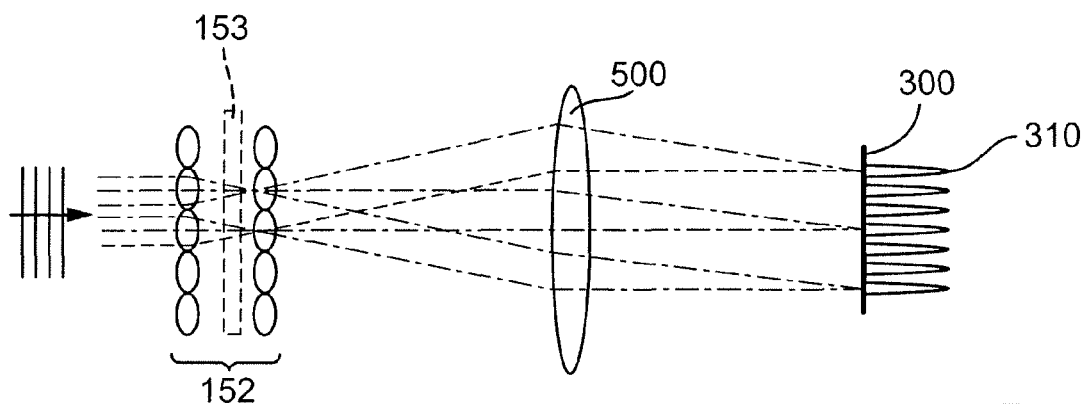

FIGS. 3A, 3B schematically show some assemblies of the pupil shaping unit 150 which are situated between the optional deflection mirror 151 and the multimirror array 300. The illustration of the optional lens array 155 has been omitted. FIG. 3A shows how an individual partial illumination beam bundle directed through a channel of the fly's eye condenser 152 is imaged onto the multimirror array 300 with the aid of the fly's eye condenser and the downstream Fourier optical system 500. The Fourier optical system is operated here as a condenser and arranged in such a way that the second fly's eye channel plate 152A of the fly's eye condenser is situated in the entrance-side (front) focal plane and the multimirror array 300 is situated in the exit-side (back) focal plane of the Fourier optical system 500. For illustration purposes, the ray paths of selected rays of the partial illumination beam bundle are illustrated in the form of solid and dashed lines; the optical axis 103 is dash-dotted. The solid lines represent those rays of the partial illumination beam bundle which impinge on the corresponding fly's eye channel of the fly's eye condenser 152 at a largest possible angle. The dashed lines, by contrast, represent those rays which impinge on the individual fly's eye channel parallel to the optical axis and hence at a smallest possible angle. Consequently, the divergence of the partial illumination beam bundle upstream of the fly's eye condenser is given by the full aperture angle between the imaging ray paths of the solid lines. The entrance-side divergence $DIV_E$ is represented symbolically in FIG. 3A by a filled-in circle, the filled-in area of which is intended to be a measure of the divergence of the partial illumination beam bundle.

Downstream of the fly's eye condenser 152 in the through-radiation direction, that is to say after the fly's eye condenser, it is the imaging ray paths of the dashed lines which determine the divergence of the partial illumination beam bundle. This exit-side divergence $DIV_A$ is in turn represented symbolically in the form of a filled-in circle, the area of which is greater than that of the circle representing the entrance-side divergence, as a result of which the divergence-increasing effect of the fly's eye condenser 152 is illustrated.

FIG. 3B shows, in contrast to FIG. 3A, the illustration of two partial illumination beam bundles which are passed through different fly's eye channels of the fly's eye condenser. Both partial illumination beam paths represent imaging ray paths of illumination rays which run parallel to the optical axis and therefore impinge perpendicularly on the fly's eye condenser. It can be discerned that the partial exposure beam bundles passed through different fly's eye channels are superimposed with the aid of the Fourier optical system 500 in the region of the multimirror array 300. The imaging ray paths are superimposed at the same location on the multimirror array 300 even though they originate from two different fly's eye channels.

If the two partial illumination beam bundles illustrated have a spatial coherence with respect to one another, then in the case of high spatial coherence this can have the effect that from the superimposition on the multimirror array, periodic intensity fluctuations arise across the multimirror array, which are illustrated schematically by an intensity function 310. Therefore, one or a plurality of coherence-reducing elements can be inserted into the beam path, for example suitable phase elements 153 in the region of the fly's eye condenser. A phase element can be designed in such a way that it influences the relative phases of different partial exposure beam bundles in the region of the fly's eye condenser differently and therefore phase-shifts them relative to one another, with the result that in the region of the superimposition at the multimirror array, a superimposition of many periodic functions arises which overall lead to a considerable reduction of the extent of the intensity fluctuations in the region of the multimirror array.

The use of phase elements is explained for example in the U.S. provisional application bearing Ser. No. 61/015,918 in the name of the applicant, which was filed on Dec. 21, 2007 and the disclosure content of which is incorporated by reference in the content of the description.

In order to optimize lithography processes, it is generally desirable to set the two-dimensional intensity distribution in the pupil shaping surface of the illumination system with high accuracy and high spatial resolution. If the illumination pupil is structured using a light modulation device having a two-dimensional array arrangement of individually drivable individual elements which can be used to alter the angle distribution of the impinging radiation (such as, for example, multimirror array 300), then the spatial resolution can be achieved by a correspondingly large number of individual elements with an adapted action characteristic. Thus, by way of example, the multimirror array can contain more than 500 or more than 1000 or more than 2000 or more than 4000 drivable individual elements. On the other hand, the construction becomes more complex and the structural size becomes larger, the more individual elements are to be accommodated, such that the upper limit for the number of individual elements for practical reasons is often a few tens of thousands of individual elements, for example fewer than 80 000 or fewer than 60 000 or fewer than 40 000 individual elements. Light modulation devices having a high spatial resolution therefore generally have an area extent which amounts to at least one or a plurality of square centimeters and can be for example between approximately 2 cm² and 80 cm² to 100 m² or more.

In order to achieve a complete illumination of all the individual elements of the light modulation device which are provided for use, it is desirable, therefore, for the cross section of the illumination beam bundle to be adapted to that cross-sectional area of the light modulation device which is to be illuminated. In the case of a laser beam bundle entering into the pupil shaping unit and having typical cross-sectional areas of 10 to 100 mm², for example, an adaptation of the beam cross section to the size of the light modulation device that is to be illuminated is thus desired. This task is undertaken by the Fourier optical system 500 in the embodiments described, this system being explained in greater detail below.

Figure 4A:
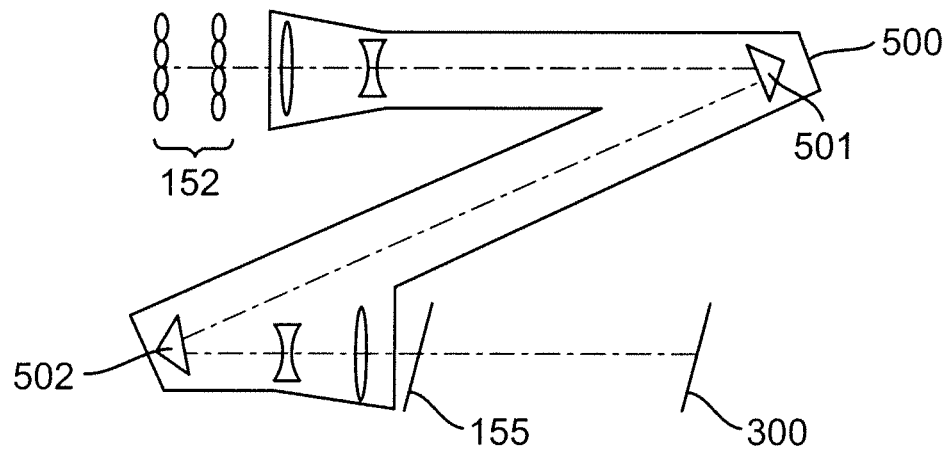
FIG. 4 shows in 4A a schematic illustration of a pupil shaping unit with a fly's eye condenser and a folded Fourier optical system disposed downstream, and in FIG. 4B a pupil shaping unit with a different light mixing device and a folded Fourier optical system disposed downstream.
Figure 4B:
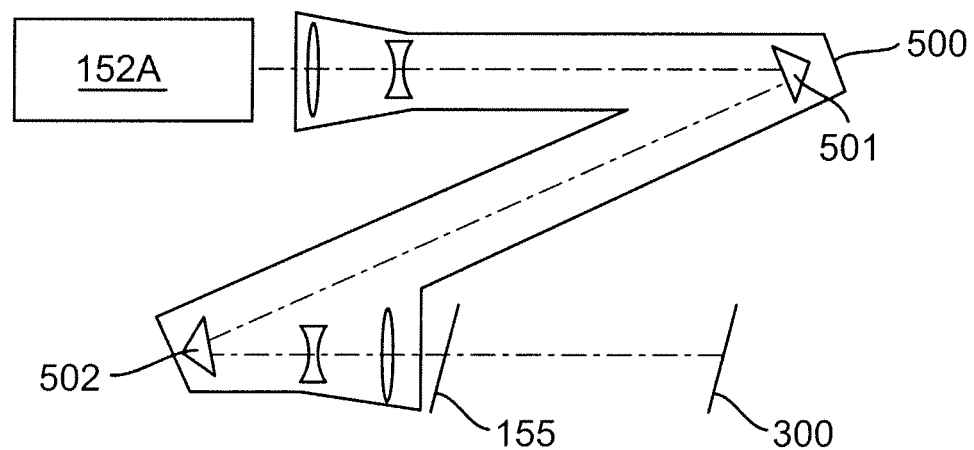

In this respect, FIG. 4 shows in 4A a schematic illustration of the pupil shaping unit with fly's eye condenser 152, Fourier optical system 500, lens array 155 and micromirror array 300. The Fourier optical system is folded in Z-shaped fashion for reasons of structural space, for which purpose two deflection prisms 501, 502 having planar reflective deflection mirror surfaces are arranged in the beam path. FIG. 4B shows a variant in which the fly's eye condenser has been replaced by a different light mixing device 152A, which can contain for example a rod integrator or an optical fiber or a corresponding optical fiber bundle. The Fourier optical system 500 is designed in such a way that it is able to convert an input beam bundle having small divergence into a beam bundle having a relatively large cross section. For this purpose, the relatively small input-side ray angles are converted into ray heights at the exit side of the Fourier optical system.

In this case, the beam bundle passing through defines an entrance surface 511 in the entrance plane and an exit surface 521 in the exit plane, the exit surface being related to the entrance surface via a Fourier transformation. In this case, the local radiation power distribution of each individual surface element in the entrance surface 511 is distributed over the entire surface of the exit surface, with the result that the radiation power originating from the entrance-side surface elements is in each case additively superimposed in the exit surface. This results in a homogenization of the local radiation power.

The Fourier optical system 500, also referred to hereinafter as "F optical unit" for short, has five lenses and no further optical elements having refractive power, that is to say is constructed purely refractively. The lenses are arranged in two lens groups LG1, LG2 spaced apart from one another. The entrance-side first lens group LG1 has an entrance-side first lens L1-1 having positive refractive power (positive lens, p-lens) in the form of a biconvex lens and an exit-side second lens L1-2 having negative refractive power (negative lens, n-lens) in the form of a negative meniscus lens that is concave on the exit side. The second lens group LG2, which is arranged at a large distance d downstream thereof, has an entrance-side first lens L2-1 having negative refractive power in the form of a biconcave lens, and two exit-side second lenses, namely a positive meniscus lens L2-2 that is concave on the entrance side and a downstream biconvex positive lens L2-3, which forms the last lens of the Fourier optical system on the exit side.

The system data are specified in Table A. The column "Radius" denotes the radius of curvature of the respective surfaces; the column "Thickness" denotes the center thickness on the optical axis.

TABLE A

| Group | Element | Distance d [mm] | Surface | Radius r [mm] | Shape | Thickness [mm] | Material |
|---|---|---|---|---|---|---|---|
| LG1 | L1-1 | | S1 | 276 | Convex | 10 | CaF2 |
| | | | S2 | 3910 | Convex | | |
| | | 300 | | | | | |
| LG1 | L1-2 | | S3 | 154 | Convex | 3 | |
| | | | S4 | 67.66 | Concave | | CaF2 |
| | | 1254 | | | | | |
| LG2 | L2-1 | | S5 | 73.45 | Concave | 4 | CaF2 |
| | | | S6 | 21.76 | Concave | | |
| | | 182 | | | | | |
| LG2 | L2-2 | | S7 | 403.8 | Concave | 12 | CaF2 |
| | | | S8 | 133.6 | Convex | | |
| | | 56 | | | | | |
| LG2 | L2-3 | | S9 | 771.4 | Convex | 15 | CaF2 |
| | | | S10 | 307.5 | Convex | | |

On the basis of the exemplary embodiment of a Fourier optical system 500 in FIG. 5, a more detailed explanation is given below of the construction and function of a Fourier optical system 500 designed for use as a beam adapting system in the illumination system of a microlithography projection exposure apparatus. The Fourier optical system transforms the radiation power distribution present with very small geometrical flux and high power, which distribution is present in the entrance plane 510 or transmitter plane of the Fourier optical system, whilst maintaining the geometrical flux, into the exit plane 520, which is Fourier-transformed with respect to the entrance plane and which can also be referred to as the receiver plane. In the case of the Fourier optical system incorporated into the illumination system, the receiver plane 520 can lie, for example, in the vicinity of the lens array 155. In Between the vertex points of the entrance-side first system surface S1 of the weakly positive first lens L1-1 and the convex, exit-side last system surface S10 of the exit-side positive lens, there is a distance L specifying the physical structural length of the Fourier optical system. Between the exit-side last system surface S4 of the first lens group LG-1 and the entrance-side first system surface S5 of the second lens group, there is a group distance $d_G$, which is larger by a multiple than the correspondingly defined group structural lengths of the lens group LG-1 and of the second lens group LG-2.

In the case of the Fourier optical system 500, the entrance plane or transmitter plane 510 is situated at the front focal point of the Fourier optical transformer 500, while the exit plane or receiver plane 520 is situated at the back focal point of the transformer 500. The distance A between entrance plane and exit plane thus corresponds to the focal plane distance of the optical system.

The exemplary embodiment has a focal plane distance A=1750 mm and a structural length L=1665 mm. The group distance $d_G$ between the lens groups LG1, LG2 is 1254 mm. The Fourier optical system has a focal length $f_{FOS}$ of 25000 mm. The following refractive power distribution in diopters [m$^{-1}$] holds true: L1-1: 2.0; L1-2: −4.0; L2-1: −30; L2-2: 2.50; L2-3: 2.50; total refractive power: 0.040.

These values demonstrate by way of example a first special characteristic of this type of a Fourier optical system. As is known, a thin positive lens performs a Fourier transformation between its front focal plane and its back focal plane with a focal length f, wherein the distance between front and back focal plane then corresponds to twice the focal length, that is to say to a focal plane distance of 2f. Given a focal length of 25000 mm (as in the embodiment of the Fourier optical system 500), a focal plane distance of 50000 mm would thus result. The focal plane distance A=1750 mm in the exemplary embodiment is smaller by a multiple in comparison therewith, such that the Fourier optical system is constructed very compactly axially in comparison with its large focal length. This is one of the prerequisites that make it possible to integrate such a Fourier optical system into an illumination system of a projection exposure apparatus.

Further boundary conditions to be taken into account in the design of a Fourier optical system arise from the fact that the Fourier optical system within the illumination system of a microlithography projection exposure apparatus is intended to operate as a beam guiding system for high-energy laser radiation. Within the Fourier optical system, the power to be transferred is guided through optical elements having a relatively small area, which results in high local radiation powers. However, the optical material used for lenses can degrade when material-specific limit values are exceeded under radiation loading. In order to avoid degradation of the lenses, the energetic loading of the lenses, for example measured as energy density in [mJ/cm$^2$], should be kept as low as possible or should lie below a material-specific threshold value for each lens. Components which are permanently exposed to a higher radiation loading would by contrast be exchanged, under certain circumstances, during the lifetime of the optical system.

In order to avoid a radiation-dictated degradation of the lenses, the system could be constructed in such a way that the optical elements are not situated at the narrowest constrictions of the energetic flow, which can also be formulated as a desired property that the irradiated surface on the respective lenses desirably does not become too small. In principle, it would be possible to make the irradiated cross sections larger with increasing distance between transmitter plane and receiver plane, that is to say with larger structural space, in order in this way to avoid loadings exceeding the threshold values. However, as explained above, the distance between transmitter plane and receiver plane, and hence the structural space for the Fourier optical system, should be kept as small as possible, which in turn increases the risk of high radiation loading of individual lenses. Consequently, the structural length of the Fourier optical system and the lifetime of this Fourier optical transformer for operation with high energetic radiation represent mutually conflicting parameters. Therefore, there is a desire for special considerations in order to arrive at arrangements of refractive powers in a limited structural space between a front and a back focal point of a Fourier optical system which at the same time limit the local radiation powers to values less than material-specific limit values.

A method for determining the spatial arrangement of refractive powers taking account of the system-specific threshold values for the radiation loading is explained in more detail below. In this case, the optical system is described with the aid of parameters in the so-called diagram by Delano (Delano diagram), and this description is combined with a loading model taking account of the radiation loading. The description of optical systems with the aid of Delano diagrams is known per se and is explained below in connection with FIGS. 6 to 8 to the extent that appears useful for the present application. Principles concerning Delano diagrams can be gathered for example from the technical article "First order Design and the y-ybar diagram" by E. Delano, Applied Optics, Vol. 2, No. 12, December 1963.

Delano diagrams generally illustrate the ray heights or ray angles of two chosen rays, namely of an aperture ray and of a field ray. The aperture ray can be for example the diaphragm marginal ray (for short: marginal ray) and the field ray can be for example the diaphragm center ray. If the aperture diaphragm lies on the principal surface, then the diaphragm center ray corresponds to the principal ray (chief ray), and the principal surfaces are then simultaneously entrance and exit pupils. By contrast, if the aperture diaphragm lies in the front focal plane, then the diaphragm center ray is the focal point ray. The exit pupil is then at infinity.

Figure 6:
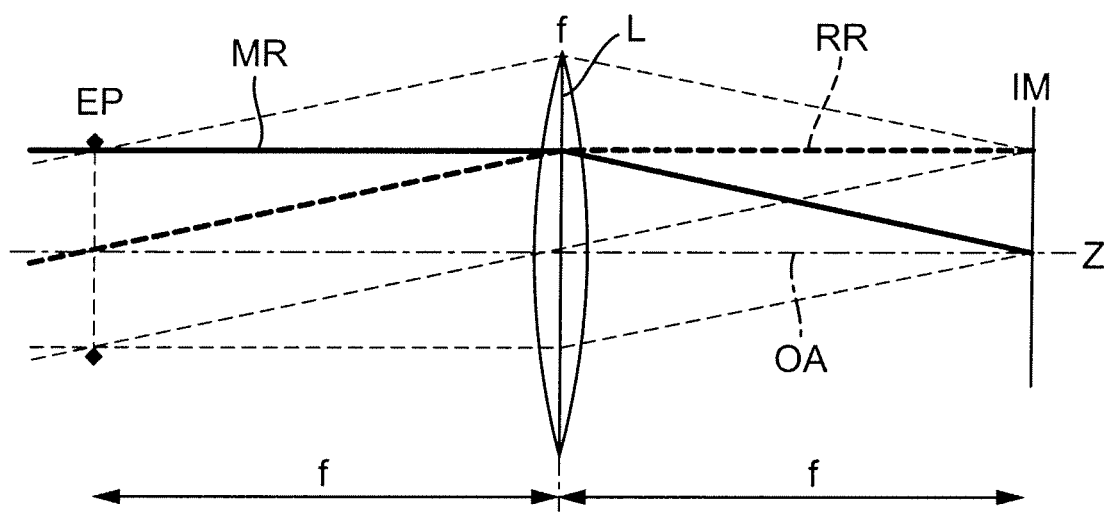
FIG. 6 schematically shows the paraxial ray path through a Fourier optical system.

FIG. 6 schematically shows the paraxial ray path of a reference ray RR and a marginal ray MR of a beam bundle through a lens L having a focal length f between the entrance pupil EP and the receiver plane IM. The reference ray used here is a ray which runs from an edge point of the object field or of the receiver field optically conjugate with respect thereto and intersects the optical axis in the region of the entrance pupil or a pupil plane optically conjugate with respect thereto. A marginal ray passes from the point of intersection of the optical axis with the object plane or the image plane optically conjugate with respect thereto to the outer edge of the aperture diaphragm or, in the illustration of FIG. 6, to the outer edge of the entrance pupil. The perpendicular distance of these rays from the optical axis yields the corresponding ray heights, which are referred to as reference ray height and marginal ray height, respectively. In a Delano diagram, the (paraxial) principal ray height is plotted against the (paraxial) marginal ray height in a planar diagram, wherein the principal ray height is plotted in the x direction (abscissa) and the marginal ray height is plotted in the y direction (ordinate). This is explained in greater detail in FIGS. 7A and B. Conventionally, the ordinate (marginal ray height) is designated by the parameter "y" and the abscissa (x direction) by the parameter ("ybar"). The ray A depicted by a dashed line corresponds to the vector addition of reference ray and marginal ray and is referred to here as "Delano ray". This ray corresponds, in each plane perpendicular to the optical axis, to a point in the plane of the Delano diagram. The projection of this ray into the y-ybar plane corresponds to the Delano diagram (FIG. 7B).

From the Delano diagram, some properties of the optical system can be read directly or calculated relatively simply. The object plane or respectively the image plane corresponds to the point of intersection with ybar, since there the reference ray height is maximal and the marginal ray height is equal to zero. A pupil plane corresponds to the point of intersection with y, since here the reference ray height is zero. A lens diameter, that is to say the optically free diameter of a lens (or of a mirror), corresponds to the sum of magnitudes |y|+|ybar|. The refractive power of an optical surface of a lens or of a mirror corresponds to a change in direction (cf. FIG. 7A). The axial distance d between two lenses corresponds to the area of a triangle spanned between the origin of the Delano diagram and the points defined by the lenses (see FIG. 8).

In addition to these properties known per se, the radiation loading of lenses or optical elements can also be represented in the Delano diagram, which is also explained in greater detail in connection with FIG. 9ff. For the loading-optimized arrangement of lenses within an optical system, the axial distance between the lenses and the energetic loading of the lenses are essential parameters, the combination of which is additionally explained in greater detail further below.

FIG. 8 illustrates that the geometrical axial distance d between two points $(y_1, \bar{y}_1)$ and $(y_2, \bar{y}_2)$, connected by a straight line in the Delano diagram, is proportional to the triangular area spanned between these points and the origin. The axial distance d can be determined as follows:

$$d = \frac{n}{H} \begin{vmatrix} y_1 & \bar{y}_1 \\ y_2 & \bar{y}_2 \end{vmatrix} \quad (A1)$$

In this equation, H is the Lagrange invariant corresponding to the geometrical flux LLW (etendue), n is the refractive index between the points and $y_i$ and $\bar{y}_i$ are the coordinates of the corresponding surfaces in the Delano diagram. The determinant of the matrix corresponds to the triangular area.

A loading model for the optical elements of the system was derived from the ray heights for reference ray and marginal ray, assuming homogeneous energy sources. This is explained in greater detail with reference to FIG. 9ff. Firstly, the derivation in a one-dimensional case (1D) shall be explained, wherein the 1D case corresponds for example to a system having cylindrical lenses (curvature in only one plane). The integral power at an arbitrary z position, that is to say at an arbitrary position along the optical axis, is proportional to the convolution of the principal ray height with the marginal ray height. Proceeding from two top hat loadings, the convolution produces a trapezoidal loading whose 50% width is given by the maximum Max(|y|, |ybar|). Owing to the conservation of energy assumed here within the system, which can also be described as conservation of the geometrical flux LLW, the trapezoid area is independent of the Z position, that is to say that $A1=A2=\ldots=A_n$. From the 50% width B of the trapezoid areas and the respective trapezoid height, the trapezoid area is calculated as B*h. With B=Max(|y|, |ybar|) and h=P it is the case that P*Max(|y|, |ybar|)=constant for all z positions. Here, h=P corresponds to the peak loading of the corresponding surface. In the two-dimensional case, that is to say in the case of system surfaces having curvatures in the plurality of directions (as in spherical optics), P*(Max(|y|, |ybar|))²=constant is obtained since the two dimensions separate.

In the Delano diagram, constant loadings are represented as a square around the origin (FIG. 9B). The loadings are higher inside the square and lower outside. The size of the square, which can be parameterized for example via the edge length or half the edge length, is therefore a measure of the loading threshold which is to be taken into account in the loading model and which should not be exceeded in any of the system surfaces. The loading model is derived here for a conventional illumination setting, but can also be extended to other settings. Likewise, the model can also be extended to other intensity profiles, such as, for example, a Gaussian distribution.

The influence of the radiation loading on the structural length and the number of refractive powers is illustrated on the basis of the following examples. By way of example, a Fourier optical system having a focal length f=25 000 mm, an entrance pupil diameter EPD=36 mm, an entrance-side numerical aperture $NA_O$=0.0018, a structural length L=1.800 mm and a loading threshold—determined by the lens materials—with radiation loading <20 mJ/cm² shall be sought. The Fourier optical system is therefore designed for a geometrical flux H=EPD/2*$NA_O$*$n_o$=0.033 mm, where H is the product of the radius EPD/2 of the entrance pupil, the entrance-side numerical aperture $NA_O$ and the entrance-side refractive index $n_o$.

Figure 10:
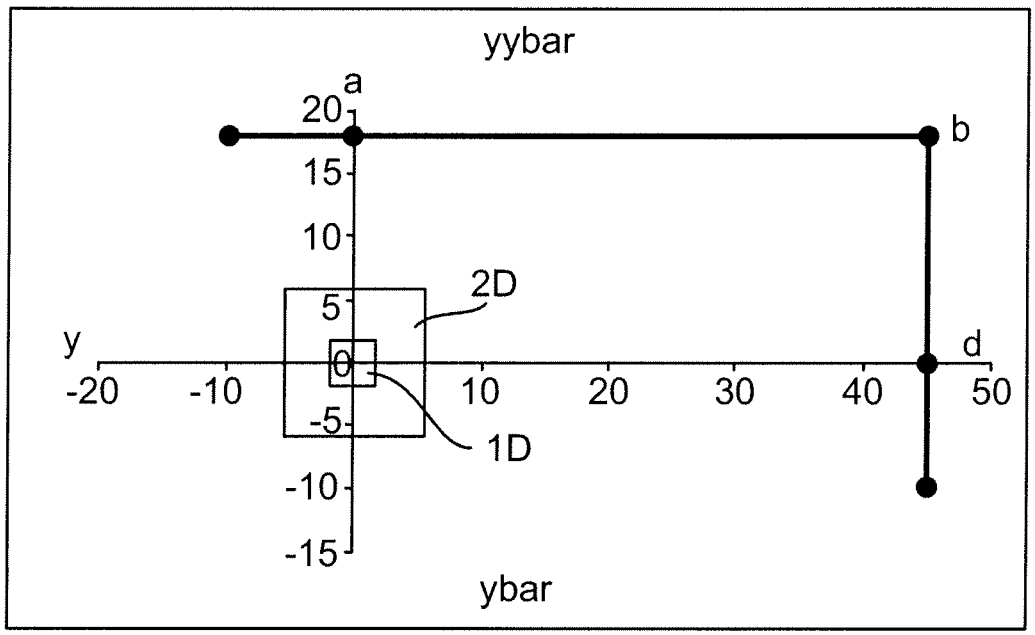
FIG. 10 shows a Delano diagram for a Fourier optical system having only one lens and refractive power b.

FIG. 10 shows the corresponding Delano diagram of this F optical unit with only one refractive power (RP). The entrance pupil is at position a, the refractive power RP is at position b, and the image plane is at position d. The outer square shows the loading threshold for 20 mJ/cm² for the 2D model, the inner square for a 1D model. The structural length of this Fourier optical system with only one refractive power is 50 000 mm, which corresponds to twice the focal length.

As already explained in connection with FIG. 8, the area inscribed by the Delano ray toward the origin is intended to be as small as possible if the structural length of a system is intended to be made as short as possible. A Fourier optical system having two refractive powers, that is to say having lenses at the positions a and d in FIG. 10, would only halve the structural length.

Figure 11:
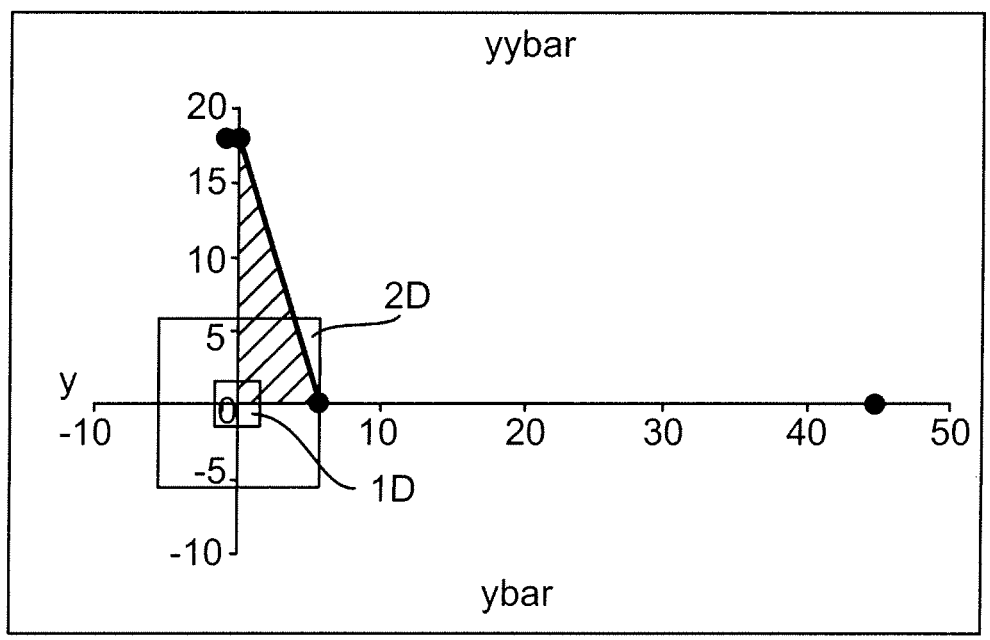
FIG. 11 shows a Delano diagram for a Fourier optical system having three refractive powers.

FIG. 11 elucidates that at least three refractive powers are desired in order to significantly shorten the structural length. In this respect, FIG. 11 shows the Delano diagram of a Fourier optical system having three refractive powers (3-RP optical unit) in the sequence positive refractive power—negative refractive power—positive refractive power (pnp). In the Delano diagram, it becomes clear that a short structural length and a low peak loading mutually impede one another. Since none of the lens surfaces is to be arranged within the outer square 2D if the peak loading is not to be exceeded, this results in a minimum distance proportional to the area contained in the hatched triangle.

Figure 12:
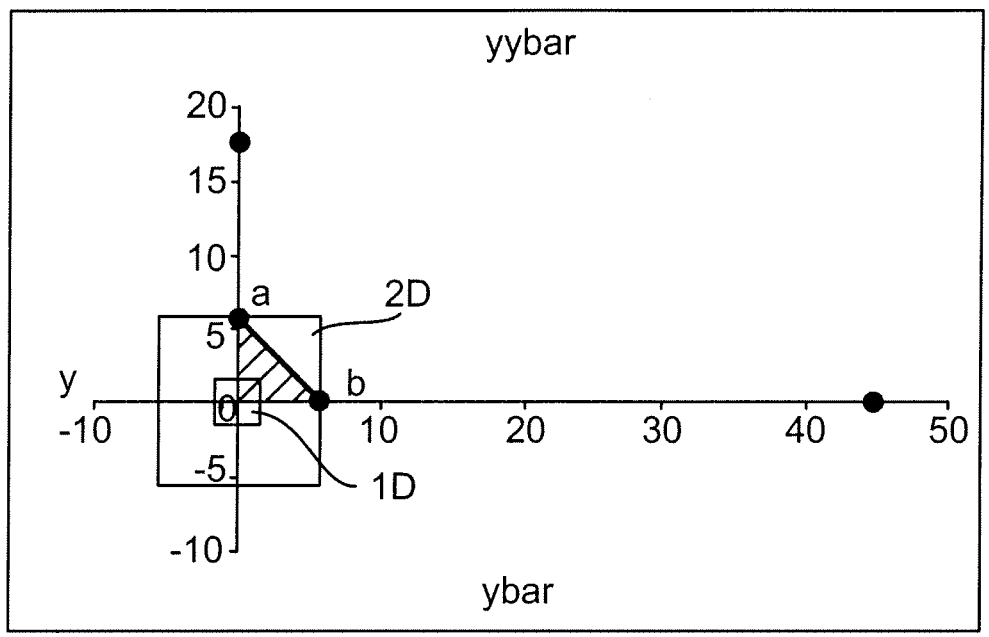
FIG. 12 shows a Delano diagram of a Fourier optical system having four lenses and refractive powers.

FIG. 12 schematically shows the Delano diagram of a Fourier optical system having four lenses (4-RP optical unit) with the refractive power sequence positive-negative-negative-positive between entrance pupil and image plane. This pnnp system only has a structural length of 1 600 mm, which can be discerned from the fact that the hatched triangle area between the origin and the projection of the Delano ray is significantly smaller than that in FIG. 11 or FIG. 10.

The distance formula explained in connection with FIG. 8 for the distance d between lenses in combination with the loading model can then be used to derive what minimum distance at least has to be present between the refractive power a near the pupil and the refractive power b near the field if the Fourier optical system is designed for transferring a radiation energy E per unit time with a geometrical flux and a peak energetic loading P on the lens surfaces is not to be exceeded. In this description, it is declared that n is the refractive index in a medium between the lenses, H is the Lagrange invariant indicating the geometrical flux in accordance with H=EPD/2*$NA_O$*$n_0$[m], E is the energy (in [J], which is to be transported through the optical system, and P is the peak loading on the lenses (in [J/mm²] for the two-dimensional case (2D) and in [J/mm] for the one-dimensional case (1D). The following then arises for the two-dimensional loading model:

$$d = n/H * E/(P_a P_b)^{1/2} \quad (A2)$$

and for the one-dimensional loading model (for example, for cylindrical lenses), $$d = n/H * E^2/(x_a P_a x_b P_b) \quad (A3)$$

In (A3), the parameters $x_a$ and $x_b$ respectively indicate the ray extent in the non-folded direction.

Figure 5:
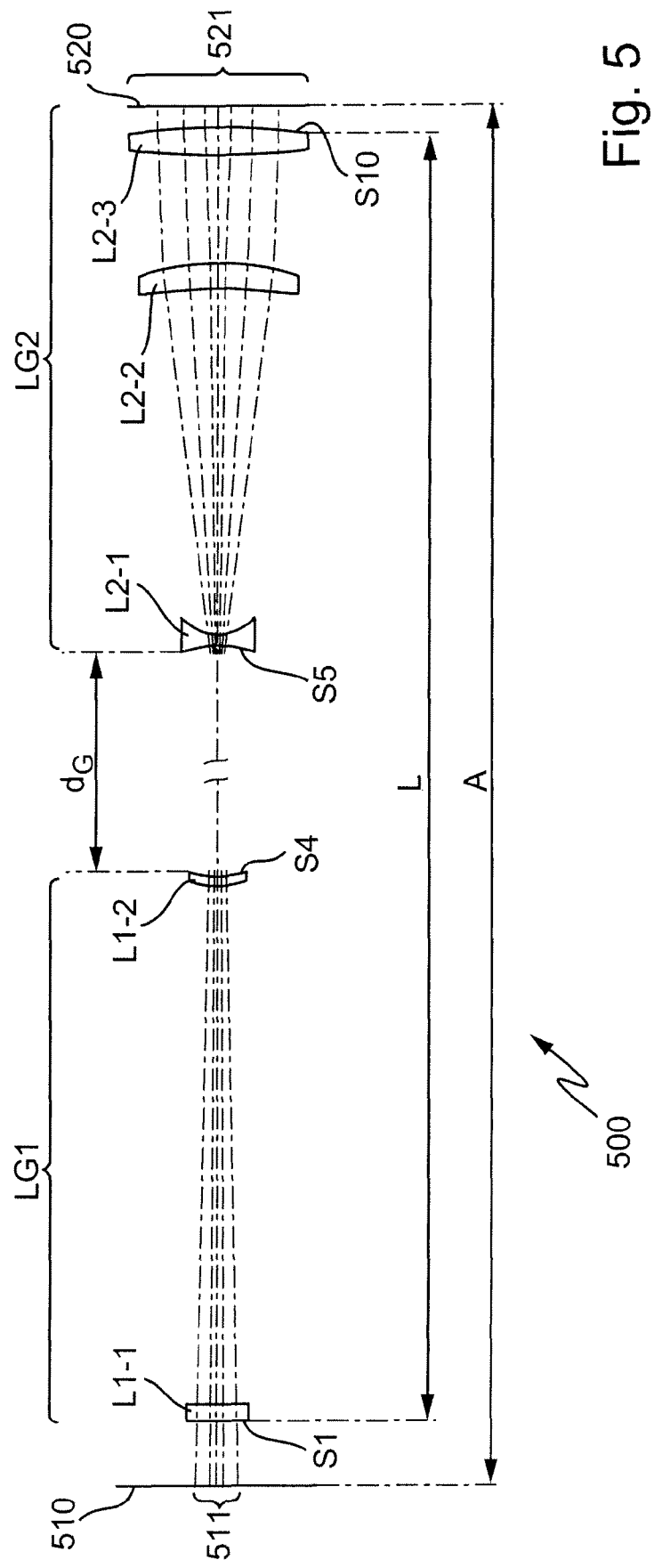
FIG. 5 shows a meridional lens section through an embodiment of a Fourier optical system which can be used in the pupil shaping unit.

The distance d can correspond to the above-defined group distance $d_G$ between the exit-side last system surface of the first lens group and the entrance-side first system surface of the second lens group (cf. FIG. 5).

A loading-optimized Fourier optical system can be designed for example such that the loading on these lenses which are particularly jeopardized energetically (lens a corresponds to the last lens of the entrance-side lens group LG1 and lens b corresponds to the first lens of the exit-side lens group LG2) is distributed approximately uniformly, such that $P_a$ is approximately $P_b$. A nonuniform loading of the two lenses is also possible as long as the individual loadings do not lie above the threshold. If it is taken into consideration that the group distance $d_G$ describes the axial distance between the refractive powers near the field of the first lens group LG1 and the refractive powers near the pupil of the second lens group LG2, then a Fourier optical system having a very long focal length and by contrast a very short structural length can be created by essentially setting the above-mentioned smallest possible group distance between the lens groups. A shorter distance will always result in a higher loading of at least one of the two highly loaded lenses, whereby the risk of an excessively high radiation loading of the corresponding lens and an associated degradation of the lens increases.

In the design of Fourier optical systems for application in illumination systems of microlithography projection exposure apparatuses, the abovementioned parameters can lie for example in the following ranges. The energy E which is to be transported through the Fourier optical system can lie for example in the range of between 2 mJ and 20 mJ, in particular in the range of between 5 mJ and 10 mJ, and can be for example be approximately 7 mJ to 8 mJ. The Lagrange invariant H can lie for example between 0.01 mm and 0.2 mm, in particular in the range of between 0.02 mm and 0.1 mm, for example in the range around 0.03 mm to 0.05 mm.

With regard to the very small divergence of the radiation to be transferred at the entrance side of the Fourier optical system, the Lagrange invariant can also be parameterized using the marginal ray and reference ray heights and marginal ray and reference ray angles. $H=n*(y*\sin(\bar{u})-\bar{y}*\sin(u))$ then holds true, where n is the refractive index, y is the marginal ray height, ybar is the reference ray height, u is the marginal ray angle and ubar is the reference ray angle.

The material-specific peak loadings P can lie for example in the range of between 5 mJ/cm², in particular in the range around approximately 10 mJ/cm², when calcium fluoride (CaF₂) is used as lens material, while it can lie for example of the range between 0.2 mJ/cm² and 1.5 mJ/cm², in particular in the range around approximately 0.5 mJ/cm², when synthetic fused silica is used. The peak loading can also be higher in some cases, for example, when the current material properties are improved. By way of example, it may be possible to shift the range of the permissible peak loading of calcium fluoride to higher values, for example, as far as the range around approximately 20 mJ/cm² or around approximately 40 mJ/cm² or around approximately 80 mJ/cm².

The method using Delano diagrams just described was used to obtain the loading-optimized construction of the embodiment in FIG. 5. Important data of this exemplary embodiment can be summarized as follows:
Transmitter plane at the front focal point of the Fourier optical system
Diameter of the entrance surface: 35 mm
Distance to the first element L1-1: 75 mm
Receiver plane at the back focal point of the Fourier optical system
Diameter of the exit surface: 100 mm
Distance to the last element L2-3: 10 mm
Distance A between transmitter and receiver (corresponds to focal plane distance): 1750 mm
Group distance $d_G$: 1254 mm
Focal length $f_{FOS}$: 25 000 mm
Ratio of structural length L to focal plane distance A: 0.950
Ratio of group distance/focal length ($d_G/f_{FOS}$): 0.050
Ratio of structural length/focal length ($L/f_{FOS}$): 0.075

The area relationships and loading ratios are compiled in Table B below:

TABLE B

| | Diameter [mm] | Area [mm²] | Loading ratio normalized to loading in entrance surface |
|---|---|---|---|
| Entrance surface | 35 | 1225 | 1 |
| Surface having maximum loading (smallest system surface) | 12 | 144 | <9-fold |
| Exit surface | 100 | 10 000 | 0.1225-fold |

Figure 13:
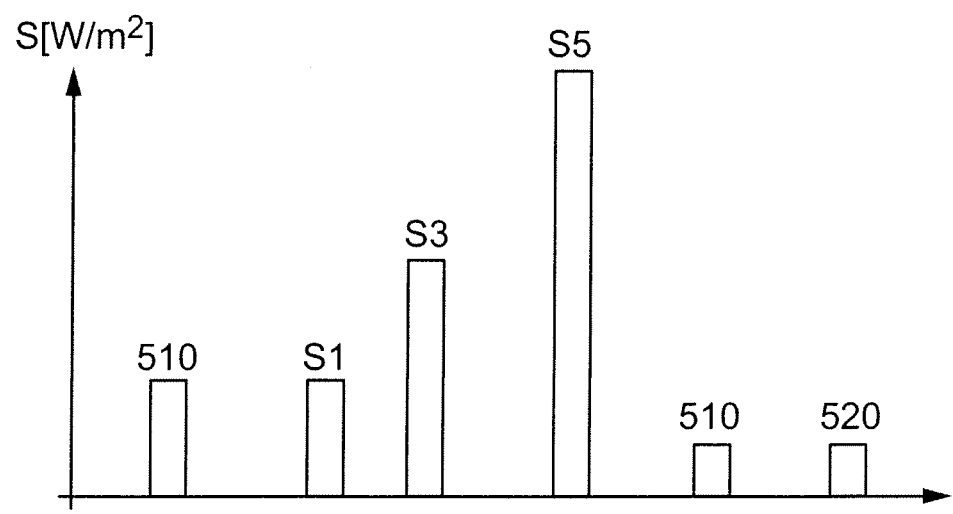
FIG. 13 shows a semi-quantitative diagram of the area-related radiation power density S for distinguished surfaces of a Fourier optical system.

For illustration, FIG. 13 shows a semi-quantitative diagram in which the area-related radiation power density S in [W/m²] is plotted for various distinguished surfaces of the system in a bar chart. The diagram reveals, inter alia, that the radiation power density is higher by a factor of 2 in the entrance plane (transmitter plane) 510 than in the exit plane (receiver plane) 520, Fourier-transformed with respect thereto, since the area through which radiation passes is correspondingly larger than in the entrance plane on account of the beam expansion. The highest radiation loading occurs at the entrance-side negative lens L2-1 of the second lens group LG2, onto which the radiation bundle is focused by the lenses of the first lens group. However, despite the very small structural length, the radiation power density at the lens L2-1 having the highest loading is less than 9 times the magnitude of the area-related radiation power density in the entrance surface, and with a value of approximately 8.0 mJ/cm² it lies significantly below the material-specific destruction threshold of approximately 10 mJ/cm² of the synthetic fused silica used.

The refractive power sequence pnnp is not the only possibility for constructing a Fourier optical system having a comparable telefactor TF=(L/$f_{FOS}$). Further variants having a similar structural length are possible with the refractive power sequences pppp, pnpp or ppnp.

Figure 14A:
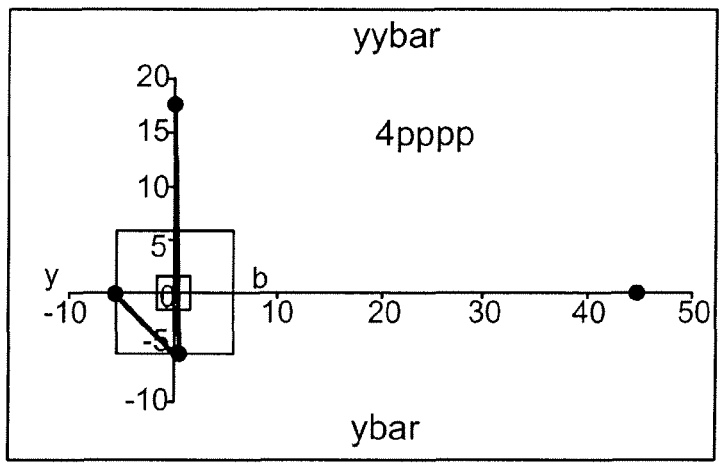
FIG. 14 shows simplified Delano diagrams for Fourier optical systems having in each case four individual lenses and different refractive power sequences, namely pppp in FIG. 14A, pnpp in FIG. 14B and ppnp in FIG. 14C.
Figure 14B:
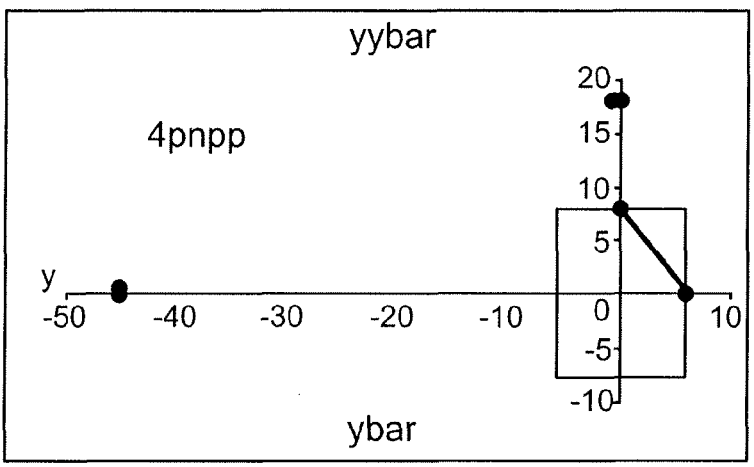
Figure 14C:
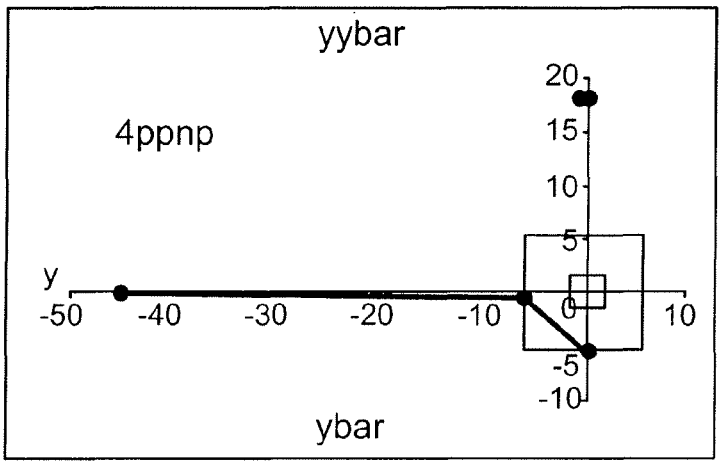

FIG. 14 shows corresponding Delano diagrams. All the examples are calculated under the boundary conditions $f_{FOS}$=25 000 mm, EPD=36 mm, NA$_O$=0.0018 and a structural length of the second lens group of less than 250 mm and are designed for a maximum loading of 20 mJ/cm². FIG. 14A shows the Delano diagram of an exemplary embodiment of a four-lens system having the refractive power sequence pppp. The total structural length is 1526 mm. FIG. 14B shows the Delano diagram for a four-lens system having a refractive power sequence pnpp and a structural length of 1576 mm. FIG. 14C shows the Delano diagram for a four-lens system having a refractive power sequence ppnp and a structural length of 1576 mm. The lenses are individual lenses in each case.

As is known, in some cases it may be expedient to divide an individual lens into two or more lenses, in which case the refractive power of the multilens lens group that arises can then substantially correspond to the refractive power of the individual lens. Additional degrees of freedom are thereby possible for example in the correction of aberrations. Further variants having 5, 6 or more lenses and corresponding refractive power combinations are correspondingly likewise possible. However, the systems having four individual lenses constitute representative basic forms for constructing axially compact systems having a long focal length with a relatively small telefactor $L/f_{FOS}$, for example with a telefactor of less than ⅙ or ⅛ or ⅒.

The Fourier optical system 500 is telecentric on its input side (transmitter side) and on its output side (receiver side). Specifically in order to allow the radiation to pass substantially perpendicularly through the exit plane (receiver plane), three lenses are provided in the second lens group LG2, wherein the exit-side last lens L2-3 substantially provides for the exit-side telecentricity.

In the exemplary embodiment, all the lens surfaces are spherical. In other embodiments, at least one of the lenses has at least one aspherically shaped lens surface. In particular, the exit-side lens surface S10 nearest the exit plane can have an aspherical shape, particularly in order to contribute effectively to the exit-side telecentricity.

In order to obtain a uniform superimposition of the local radiation powers in the exit plane, the Abbe sine condition should be at least approximately met. If there are appreciable deviations from the sine condition, variance of the local irradiances and hence incomplete homogenization in the exit plane can occur. It has been found that complying with the sine condition can be simplified if the refractive power of the entrance-side lens element of the second lens group, that is to say of the lens L2-1, is distributed among two or more lens elements. In such exemplary embodiments, the second lens group can accordingly have four or five lens elements.

Figure 15:
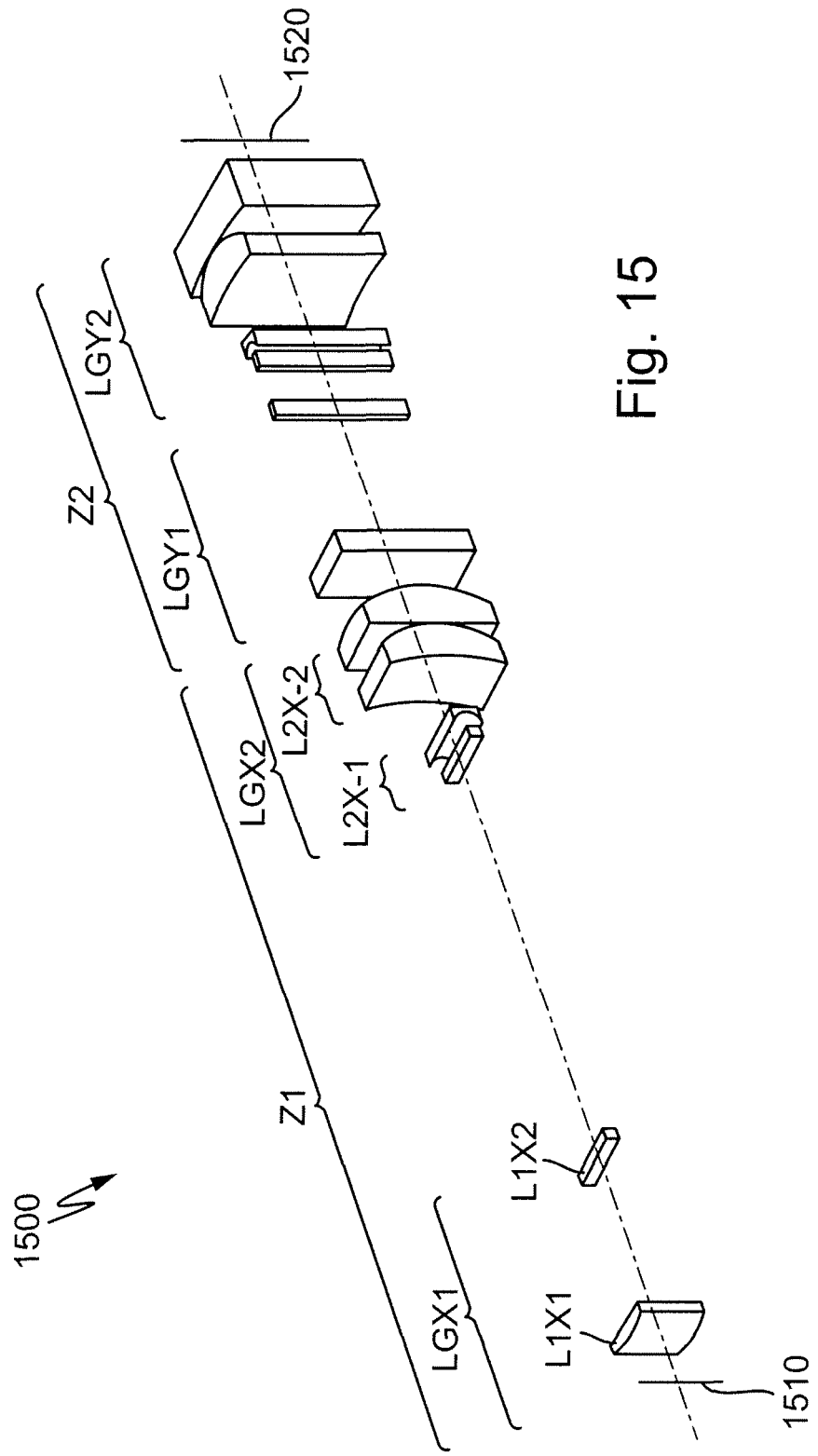
FIG. 15 shows a schematic perspective illustration of a Fourier optical system with cylindrical lenses.

It is explained below on the basis of a further exemplary embodiment that is it possible to further reduce the above-described lower limit for the structural length by using at least one pair of two cylindrical lens systems oriented orthogonally with respect to one another. In this respect, FIG. 15 shows by way of example a perspective illustration of a Fourier optical system 1500 including two cylindrical optical systems Z1 and Z2 disposed in series. The first cylindrical optical system Z1, which directly follows the entrance surface 1510, consists exclusively of cylindrical lenses which have a finite radius of curvature in the x direction (and therefore a refractive power in the x-z plane), but are not curved in the orthogonal y direction and therefore have no refractive power in the y direction (that is to say in the y-z plane). These cylindrical lenses are also referred to here as "x lenses". The second cylindrical lens system Z2 disposed downstream exclusively has lenses having a finite radius of curvature in the y direction and an infinite radius of curvature in the x direction (y lens). The first cylindrical lens system, constructed with x lenses, has two lens groups LGX1, LGX2 spaced apart from one another, between which there is a distance that is greater than the partial structural length of the lens groups LGX1 and respectively LGX2. The entrance-side first lens group LGX1 has an entrance-side first lens L1X-1 having a positive refractive power and an exit-side second cylindrical lens L1X-2 having a negative refractive power. The second lens group LGX2, arranged at a large distance downstream thereof, has an entrance-side first lens L2X-1, the refractive power of which is divided between two lens elements, and an exit-side second lens L2X-2, the refractive power of which is divided between two directly successive cylindrical meniscus lenses having a positive refractive power. Individual lenses can also be provided in each case instead of the divided lenses. The second cylindrical lens system Z2, acting in the y direction, has a corresponding construction with an entrance-side first lens group LGY1 and an exit-side second lens group LGY2 and a refractive power sequence pnnp. The first cylindrical lens system Z1 brings about a constriction of the radiation power of the entering beam bundle exclusively in the x direction, while the second cylindrical lens system disposed downstream acts exclusively in the y direction orthogonal thereto. The one-dimensional refractive powers are adapted to one another in such a way that, in the case of an entrance-side square input field, the output field is also again square. An explanation is given below as to why such a construction having a large number of cylindrical lenses can, in respect of loading aspects, nevertheless lead to an axially more compact Fourier optical system than a construction having rotationally symmetrical lenses.

Figure 16:
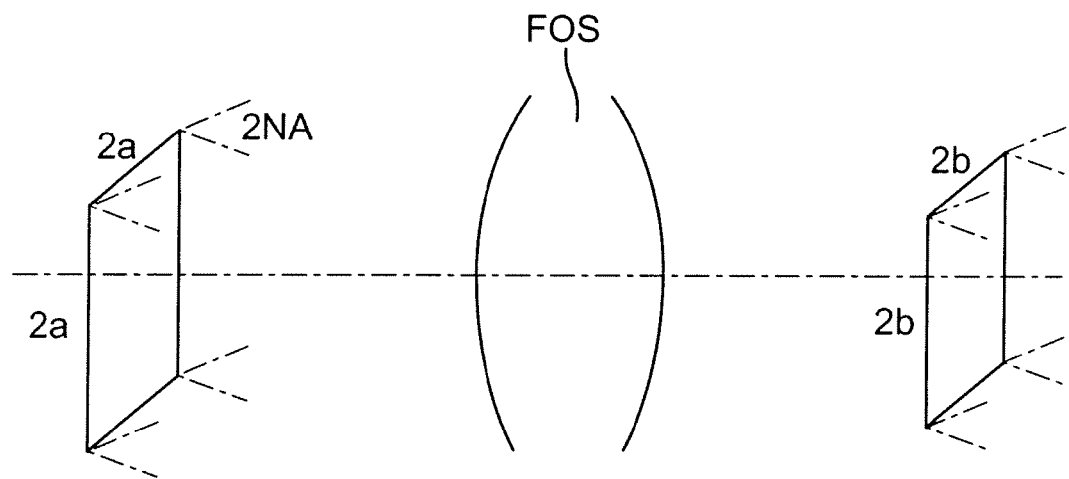
FIG. 16 shows a schematic illustration of a Fourier optical system with associated input field and output field.

In this respect, FIG. 16 shows by way of example a schematic illustration of an input field—shown on the left—having a square cross-sectional area, which is transformed into an output field—shown on the right—by a Fourier optical system FOS. It shall be supposed that the input beam bundle has a square cross section with edge length 2*a* and a divergence DIV corresponding to twice the numerical aperture NA of the beam bundle (DIV=2NA). As explained above, it is possible to determine the minimum permissible structural length in respect of radiation loading aspects, using Delano diagrams. FIG. 5 shows a simple example of such a Fourier optical system having a pnnp construction and five lenses. In this case, p corresponds to a lens having a positive refractive power and n corresponds to a lens having a negative refractive power. (For cases where the telecentricity of the output field is unimportant, as in the case of photographic objectives under certain circumstances, the last lens on the output side having a positive refractive power can also be dispensed with, thus resulting in a pnn construction).

Figure 17:
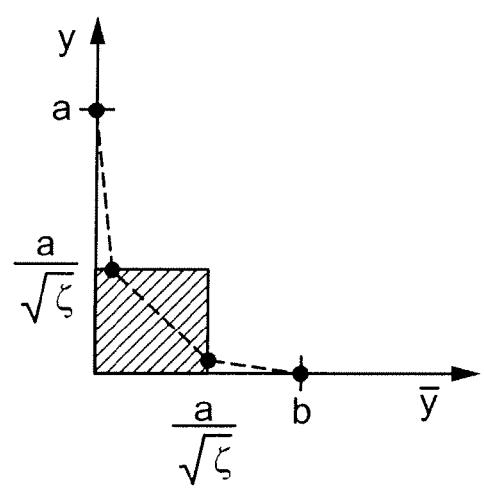
FIG. 17 shows a simplified Delano diagram similar to FIG. 12 for illustrating the loading-optimized arrangement of lenses.

FIG. 17 shows a simplified Delano diagram for a Fourier optical system with the properties from FIG. 15 having four lenses (pnnp). Lenses within the hatched region "see" an energetic loading that is greater than or equal to $\xi I_o$. The parameter $\xi$ is therefore a parameter which describes the material-specific loading upper limit of the lens material. It shall be supposed that the total power P transported through the system is constant, and $I_0=P/4a^2$ holds true.

For reasons of simplification, an isotropic input radiation field with a homogeneous intensity distribution $I_0$ shall be assumed below, that is to say that each surface element of the entrance surface "sees" the same intensity $I_0$. Furthermore, a top-hat-type angle distribution shall be assumed, which essentially means that there is a uniform ray angle distribution between a minimum ray angle and a maximum ray angle. Under these assumptions, for rotationally symmetrical optical systems, it is possible to calculate the maximum intensity in each plane along the optical axis in accordance with the following equation (B1):

$$I(z) = \frac{I_0 \cdot a^2}{\max(y, \overline{y})^2} \tag{B1}$$

In this case, $\max(y, \overline{y})$ is the maximum of the two coordinates in the Delano diagram and represents a measure of the ray extent. If the upper limit of loading is expressed by the intensity of the input ray given by $I_{max}=\xi \cdot I_0$, then the result after insertion in equation (B1) in the Delano diagram is a region forbidden for lenses and having a square shape and half the edge length $a/\sqrt{\xi}$ around the origin (see hatched region in FIG. 17). The structural length of the optical unit illustrated in the Delano diagram can then be represented by the following equation (B2):

$$d = \frac{1}{a \cdot NA} \sum_i \left| \begin{array}{cc} y_i & \overline{y}_i \\ y_{i+1} & \overline{y}_{i+1} \end{array} \right| \quad (B2)$$

where the index i runs over the nodes in the Delano diagram and thus over all the lenses. Therefore, by way of example, a Fourier optical system having four lenses having the smallest structural length has its nodes in the Delano diagram at $(0, a/\sqrt{\xi})$ and $(a/\sqrt{\xi}, 0)$. Therefore, such an idealized optical system only involves structural space between the exit-side last lens of the first lens group and the entrance-side lens of the second lens group, wherein this structural space results as follows in accordance with equation (B2):

$$d = \frac{a}{NA \cdot \xi} \quad (B3)$$

This distance d corresponds to the minimum group distance $d_G$. In the case of an optical system composed of cylindrical optical units such as is shown schematically in FIG. 15, the ray path in the case of a system having four lenses in accordance with the above example is constricted only in one dimension. The consequence of this is that the radiation loading only rises linearly with the ray constriction. Expressed in Delano coordinates, the maximum energetic loading along the optical axis can then be calculated as follows:

$$I(z) = \frac{I_0 \cdot a}{\max(y, \overline{y})} \quad (B4)$$

A comparison with equation (B1) shows that here the edge length a does not have an influence quadratically, but rather only linearly. This results in a for energetic reasons "forbidden" region for lenses in the Delano diagram with half the edge length $\sigma/\xi$ and thus a lower limit for the distance of $$d_{Cylinder}^{(1)} = \frac{a}{NA \cdot \xi^2} \quad (B5)$$

In order, however, to correspondingly shape the beam bundle in both directions orthogonal to one another via cylindrical optical units, it is possible to provide cylindrical optical units arranged one after another and having orthogonally oriented curvature surfaces. Since the radiation bundle has already been shaped in one direction, the loading limit changes in the Delano diagram for the second cylindrical optical unit to $a^2/b\xi$. This results in a minimum structural length in accordance with:

$$d_{Cylinder}^{(2)} = \frac{a^3}{b^2 NA \cdot \xi^2} \quad (B6)$$

This results in a ratio of the structural lengths of the conventional rotationally symmetrical optical unit (indicated by the minimum group distance d or $d_G$) and that with two mutually orthogonal cylindrical optical units (indicated by $d_{Cylinder}^{(1)} + d_{Cylinder}^{(2)}$) of:

$$\frac{d_{Cylinder}^{(1)} + d_{Cylinder}^{(2)}}{d} = \frac{1 + \frac{a^2}{b^2}}{\xi} \quad (B7)$$

This affords the following result: even though, in the case where cylindrical optical units are used, two Fourier optical systems for the two spatial directions (x and y directions) have to be arranged successively, the total structural length for large values of $\xi$, that is to say for large upper limits of loading, is shorter than in the case of a rotationally symmetrical Fourier optical system. If, by way of example, the input field and the output field having the same size (a=b), then the system with cylindrical optical units is shorter for $\xi > 2$.

In general, the total structural length will be somewhat greater than the relationships illustrated here under simplifying assumptions. It is of significance here firstly that a certain structural space is also desired between the lenses within a lens group (that is to say, for example, between lenses L1-1 and L1-2 and also between L2-1 and L2-2). It should also be taken into consideration that each cylindrical optical system involves an input vertex focal length and respectively output vertex focal length corresponding to the structural length of their orthogonal optical systems. Nevertheless, a Fourier optical system having a sequence of at least two pairs of orthogonally oriented cylindrical optical systems, with the same total focal length, can, under certain circumstances, be designed to be axially shorter than a round optical system (rotationally symmetrical system) of the same focal length.

Figure 18:
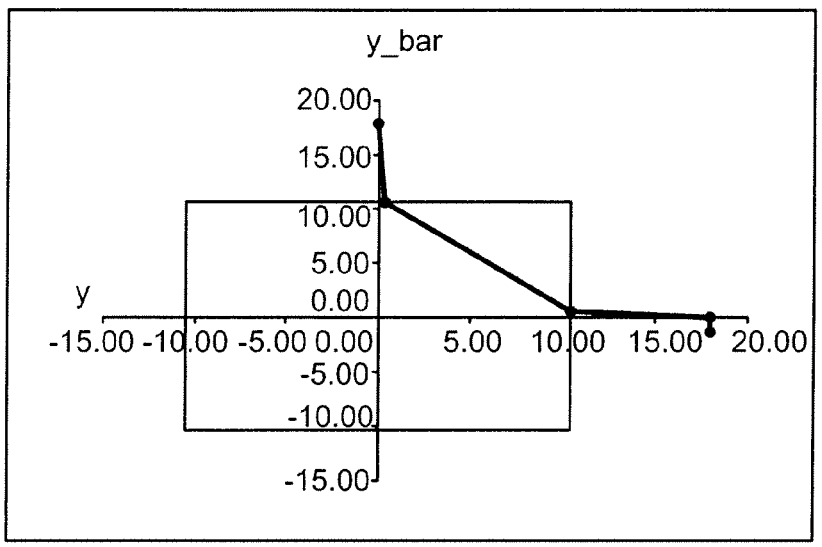
FIG. 18 shows a Delano diagram of a rotationally symmetrical Fourier optical system having four lenses and the lens sequence pnnp.
Figure 19:
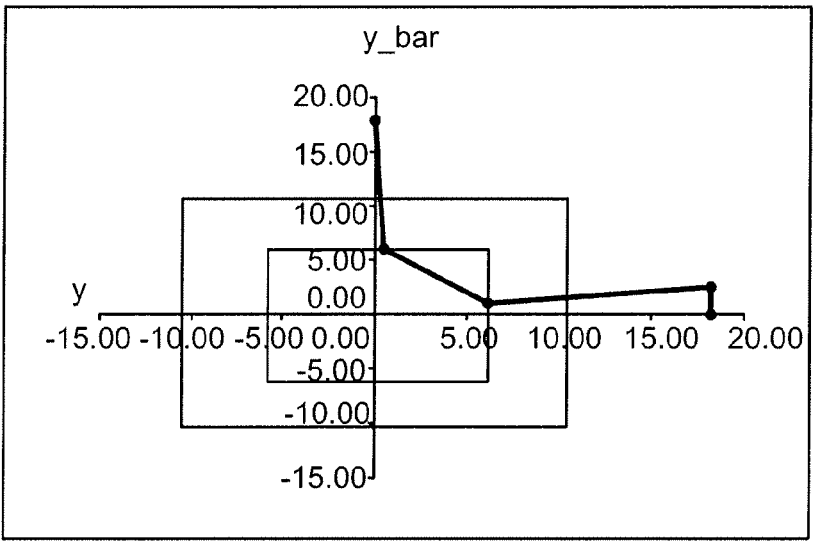
FIG. 19 shows a Delano diagram of a first cylindrical lens group having a long output vertex focal length, which is arranged in front of a second cylindrical lens group (FIG. 20) in the irradiation direction.
Figure 20:
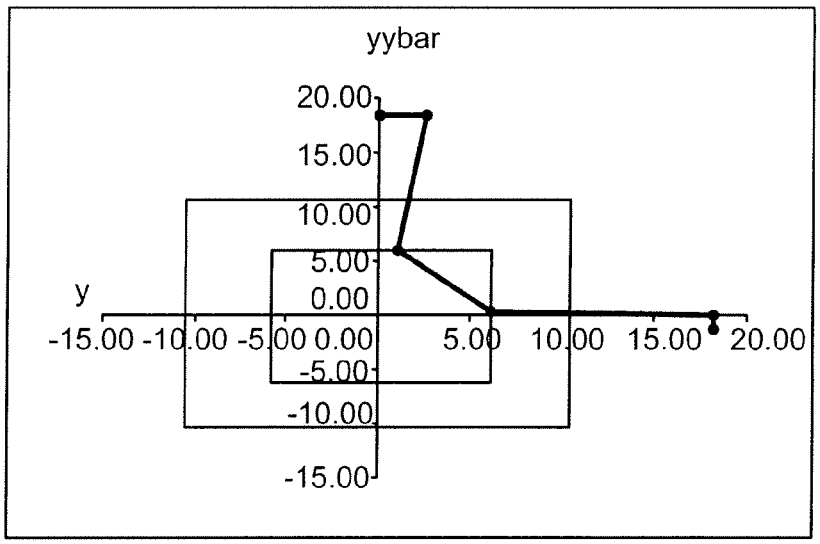
FIG. 20 shows a Delano diagram of a second cylindrical lens group, which is arranged behind a first cylindrical lens group (FIG. 19) in the irradiation direction.

In order to demonstrate the relationships, a comparative case is explained quantitatively in connection with FIGS. 18 to 20. For this example it shall be supposed that a=18 mm, NA=0.0018, b=18 mm and $\xi=3$ hold true. FIG. 18 shows the corresponding Delano diagram of a rotationally symmetrical Fourier optical system having four lenses and the lens sequence pnnp. The system has a total structural length of 3692 mm. In the case of an overall construction having cylindrical optical units, the following picture arises. FIG. 19 shows a Delano diagram of a first cylindrical optical unit having a long output vertex focal length, which is arranged upstream of a second cylindrical optical unit (FIG. 20) in the irradiation direction. The first cylindrical optical unit has a structural length of 1383 mm and an output vertex focal length of 1469 mm. The second cylindrical optical unit, the Delano diagram of which is illustrated in FIG. 20, has a structural length of 1386 mm and an input vertex focal length of 1466 mm. This results in a total structural length of the Fourier optical system constructed with cylindrical optical units of 2852 mm, which is therefore shorter approximately by a factor of 1.3 than the rotationally symmetrical optical unit having the same optical power.

The division into two "pure" cylindrical lens systems (that is to say systems constructed only with x lenses or only with y lenses) arranged one after another is not mandatory. The cylindrical lenses can also be arranged in interleaved fashion, such that x lenses and y lenses can alternate possibly multiply. As a result, the structural length can possibly be shortened further. By way of example, a construction having the refractive power sequence p_x/n_x/n_x/p_y/p_x/n_y/n_y/p_y is possible, where, for example, p_y designates a y lens having a positive refractive power.

Further exemplary embodiments of Fourier optical systems having rotationally symmetrical lenses are described below with reference to FIGS. 21 to 24.

Figure 21:
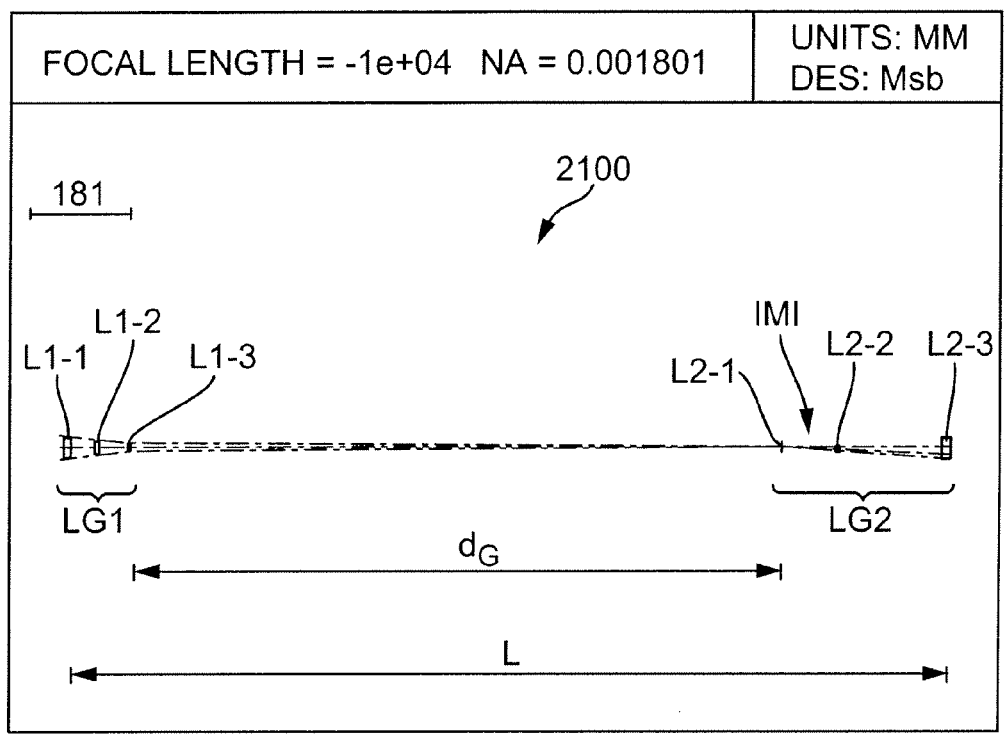
FIG. 21 depicts a Fourier optical system.

The Fourier optical system 2100 in FIG. 21 has precisely six lenses arranged in two lens groups LG1, LG2 arranged at a distance $d_G$ from one another. The entrance-side first lens group LG1 has, in this order, an entrance-side first lens L1-1 in the form of a biconvex positive lens having an aspherical entrance surface and two exit-side second lenses, namely a negative lens L1-2 that is concave on the entrance side and plane on the exit side and a negative lens L1-3 that is concave on both sides. The second lens group LG2 arranged downstream thereof at a large distance $d_G$ has an entrance-side first lens (biconvex lens) L2-1 having a positive refractive power and two exit-side second lenses, namely a biconvex positive lens L2-2 and an exit-side biconvex positive lens L2-3, which forms the exit-side last lens of the Fourier optical system.

The first lens L1-1 directly succeeding the entrance plane is composed of synthetic fused silica ($SiO_2$), while all the other lenses are composed of calcium fluoride ($CaF_2$), which is more resistant to radiation. The aspherical entrance surface of this lens is essentially designed for correcting spherical aberration. An intermediate image IMI is formed between the biconvex positive lenses L2-1 and L2-2 of the second lens group. If it is taken into account that the lenses L1-2 and L1-3 are negative lenses in each case, while the lenses L2-1 and L2-2 are positive lenses in each case, the refractive power sequence pnpp results for this system.

As in the case of the Fourier optical system 500, the entrance plane or transmitter plane is situated at the front focal point of the Fourier optical transformer 2100, while the exit plane or receiver plane is situated at the back focal point of the transformer. The system has a structural length L=1617.4 mm and a group distance $d_G$ between the lens groups LG1 and LG2 of 1180 mm. The Fourier optical system has a focal length $f_{FOS}$ of 10 000 mm. The system data are indicated in Table C analogously to the indications in Table A.

The lower part of Table C indicates the aspherical data of the aspherical entrance surface of the lens L1-1. In this application, the aspherical surfaces are calculated according to the following specification:

$$p(h)=[((1/r)h^2)/(1+SQRT(1-(1+K)(1/r)^2h^2)]+C4*h^4+C6*h^6+\ldots$$

In this case, the reciprocal (1/r) of the radius indicates the surface curvature and h indicates the distance of a surface point from the optical axis (that is to say the ray height). Consequently, p(h) indicates the so-called sagitta, that is to say the distance of the surface point from the surface vertex in the z direction (direction of the optical axis).

Table D summarizes important parameters for the further characterization of the Fourier optical system 2100. It is evident from this in particular that the telefactor $TF=L/f_{FOS}$ with TF=0.1617 is more than twice as large as in the first exemplary embodiment (FIG. 5), which is essentially attributed to the focal length reduced by the factor 2.5 by comparison with this example, since the structural lengths are essentially of the same order of magnitude.

TABLE D

| | |
|---|---|
| f FOS (Focal length F optical unit) | 10 000 |
| L | 1617.4 |
| dG | 1180 |
| dG/fFOS | 0.118 |
| L/fFOS (= TF) | 0.1617 |
| dG/L | 0.72974644 |
| Telecentricity | Telecentric |
| LLW | 0.0324 |
| Type | pnpp |
| Aspherical surfaces | 1 |
| Lenses | 6 |
| Material | SiO2 + CaF2 |

The exemplary embodiment illustrated in Table C is telecentric on the entrance side and on the exit side and is therefore designed to convert an input beam bundle having sub-

TABLE C

| Group | Element | Distance d [mm] | Surface | Radius r [mm] | Shape | Thickness [mm] | Material |
|---|---|---|---|---|---|---|---|
| LG1 | L1-1 | | S1 | 125.20 | Convex + asphere | 10 | SiO2 |
| | | | S2 | 233.83 | Convex | | |
| | | 44.25 | | | | | |
| LG1 | L1-2 | | S3 | 169.06 | Concave | 5 | CaF2 |
| | | | S4 | 0.00 | Plane | | |
| | | 53.35 | | | | | |
| LG1 | L1-3 | | S5 | 107.86 | Concave | 4 | CaF2 |
| | | | S6 | 74.20 | Concave | | |
| | | 1185.40 | | | | | |
| LG2 | L2-1 | | S7 | 29.33 | Convex | 4 | CaF2 |
| | | | S8 | 158.59 | Convex | | |
| | | 105.04 | | | | | |
| LG2 | L2-2 | | S9 | 83.09 | Convex | 4 | CaF2 |
| | | | S10 | 39.05 | Convex | | |
| | | 187.35 | | | | | |
| LG2 | L2-3 | | S11 | 297.15 | Convex | 15 | CaF2 |
| | | | S12 | 295.21 | Convex | | |

| Aspherical coefficients | | | | |
|---|---|---|---|---|
| Surface | K | C4 | C6 | C8 |
| S1 | −4.3329 | 2.4307E−07 | −3.0547E−11 | −1.3903E−15 | stantially parallel rays into an output beam bundle having in turn substantially parallel rays. Fourier optical systems of the type mentioned in this application can, however, also be designed in such a way that an entrance-side convergent beam bundle or an entrance-side divergent beam bundle is converted into an exit-side convergent beam bundle or divergent beam bundle or parallel beam bundle or that an entrance-side parallel beam bundle is converted into an exit-side convergent beam bundle or divergent beam bundle. This is explained below on the basis of an example.

If a lens having a positive (negative) refractive power is placed for example directly behind the exit surface, then the exit-side parallel beam bundle becomes a convergent beam bundle if the lens has a positive refractive power and a divergent beam bundle if the lens has a negative refractive power. The refractive power of this additional lens can also be integrated into the exit-side last optical element (here: L2-3) of the Fourier optical system. In the case of a modification of the Fourier optical system 2100, behind the exit surface, for example, a convergent beam bundle is obtained which corresponds to a lens having a focal length of 1000 mm if the radius of the exit-side last surface (S12) is shortened from 295.21 mm to 186.36 mm. In a corresponding manner, behind the exit surface, a divergent beam bundle can be obtained which corresponds to a lens having a focal length of −1000 mm if the radius of the exit-side last surface S12 is increased from 295.21 mm to 716.53 mm.

Analogously, it is also possible to adapt the Fourier optical system to a convergent or divergent entrance beam bundle by the entrance-side first lens L1-1 being given an additional refractive power that compensates for the convergent or divergent one of the incident beam bundle. Consequently, Fourier optical systems of the type described here can be designed for convergent and also for parallel or divergent input beam bundles and also for convergent, parallel or divergent output beam bundles in any desired combination. The focal length of a Fourier optical system having a divergent and/or convergent input beam bundle and/or output beam bundle should be understood in the same way as that of the corresponding compensated Fourier optical system having parallel beam bundles in the entrance surface and the exit surface.

Figure 22:
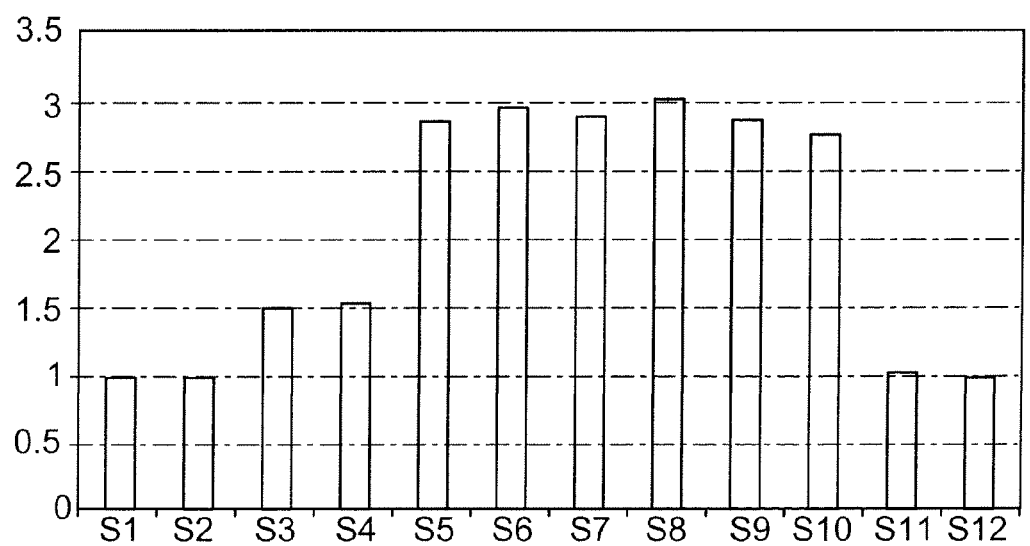
FIG. 22 shows a semi-quantitative diagram including area-related radiation power density information.

The Fourier optical system 2100, in a similar manner to the first exemplary embodiment, is also optimized with regard to the radiation loading of the inner lenses—which are particularly jeopardized by radiation—and in such a way that the radiation loading of these lenses remains below the radiation loading threshold value to be taken into consideration for calcium fluoride. For illustration purposes, FIG. 22 shows a semi-quantitative diagram in which the area-related radiation power density for the various lens surfaces S1 to S12 of the system is plotted in a bar chart. Rather than absolute values, values normalized to the radiation loading of the entrance-side first lens surface S1 are plotted. It becomes clear from this that even the lens surfaces S5 to S8 of the lenses L1-3 and L2-1 lying furthest inward are exposed only to a radiation loading which corresponds maximally to approximately three times the radiation loading of the entrance surface. The relatively uniform and at the same time relatively low loading of the lenses L1-3, L2-1 and L2-2 is particularly striking.

An exemplary embodiment with a very long focal length (50 m) will now be explained with reference to FIGS. 23 and 24. The Fourier optical system 2300 in FIG. 23 has precisely four lenses arranged in two lens groups LG1, LG2 arranged at a distance from one another. The entrance-side first lens group LG1 has an entrance-side first lenses L1-1 having a convex, aspherical entrance surface and a convex exit surface (positive lens) and also an exit-side second lens L1-2 having a negative refractive power, and it involves an entrance-side aspherical biconcave lens. The second lens group LG2, which is arranged downstream thereof at a large group distance $d_G$, has an entrance-side first lens L2-1 in the form of a biconcave negative lens and an exit-side planoconvex lens having a planar entrance surface and an aspherical exit surface. All the lenses are composed of radiation-resistant calcium fluoride. The system data are specified in Table E analogously to the specifications in Table C.

TABLE E

| Group | Element | Distance d [mm] | Surface | Radius r [mm] | Shape | Thickness [mm] | Material |
|---|---|---|---|---|---|---|---|
| LG1 | L1-1 |  | S1 | 163.87 | Convex + asphere | 10 | CaF2 |
|  |  |  | S2 | 1273.4 | Convex |  |  |
|  |  | 178 |  |  |  |  |  |
| LG1 | L1-2 |  | S3 | 53.85 | Concave + asphere | 5 | CaF2 |
|  |  |  | S4 | 926.4 | Concave |  |  |
|  |  | 1516 |  |  |  |  |  |
| LG2 | L2-1 |  | S5 | 43.29 | Concave | 3 | CaF2 |
|  |  |  | S6 | 80.35 | Concave |  |  |
|  |  | 576.3 |  |  |  |  |  |
| LG2 | L2-2 |  | S7 | 0 | Plane | 25 | CaF2 |
|  |  |  | S8 | 324.9 | Convex + asphere |  |  |

| | Aspherical coefficients | | | |
|---|---|---|---|---|
| Surface | K | C4 | C6 | C8 |
| S1 | 0.34241 | 4.8982E−09 | 1.3071E−12 | −1.6428E−15 |
| S3 | −7.6761 | −5.2529E−06 | 5.6120E−09 | −2.5781E−12 |
| S8 | −1.0823 | −1.9477E−09 | −1.3449E−14 | 5.0407E−19 |

The asphere shapes of the aspherical surfaces are essentially designed for the correction of the spherical aberrations and for the correction of coma and distortion.

Table F summarizes important parameters for the further characterization of the Fourier optical system 2300. This reveals, in particular, that the telefactor $TF=L/f_{FOS}$ with a value of TF=0.046266 has a magnitude only approximately 65% of that in the first exemplary embodiment (FIG. 5), which is essentially attributed to the focal length increased by a factor of 2 in comparison with this example, while the structural length (2313.3 mm) is only approximately 43% greater than in the first exemplary embodiment.

TABLE F

| f FOS (Focal length F optical unit) | 50 000 |
|---|---|
| L | 2313.3 |
| dG | 1516 |
| dG/fFOS | 0.03032 |
| L/fFOS (= TF) | 0.046266 |
| dG/L | 0.65534086 |
| Telecentricity | Telecentric |
| LLW | 0.0324 |
| Type | pnnp |
| Aspherical surfaces | 3 |
| Lenses | 4 |
| Material | CaF2 |

Figure 23:
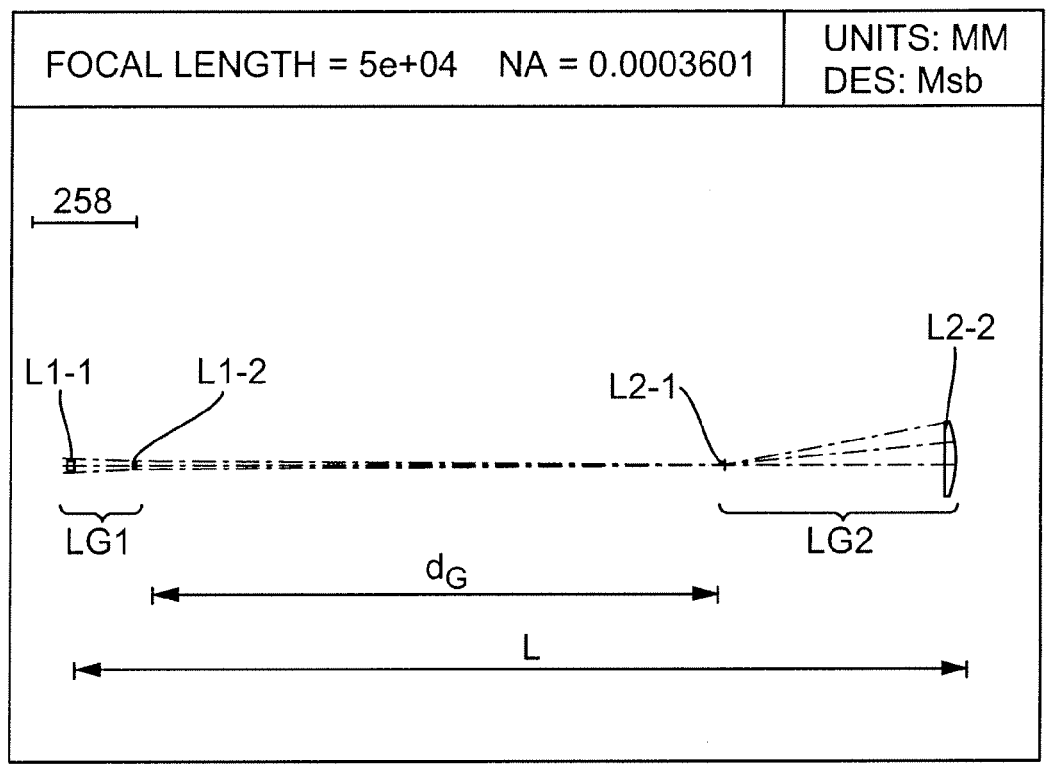
FIG. 23 depicts a Fourier optical system.
Figure 24:
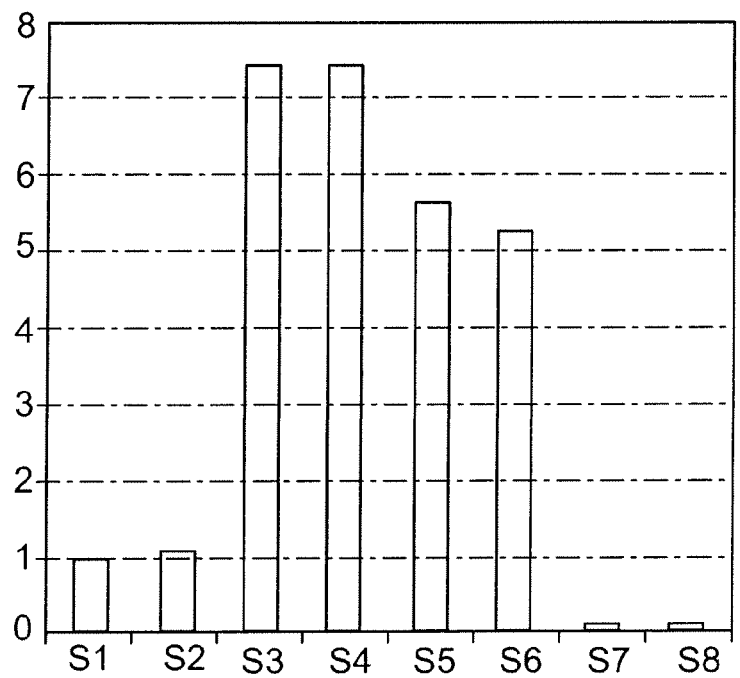
FIG. 24 shows radiation loading information.

FIG. 24 shows, analogously to FIG. 23, the radiation loading of the individual surfaces of the system, in each case normalized to the radiation loading of the entrance-side first lens surface S1. It is evident that the radiation loading of the exit-side negative lens L1-2 of the first lens group LG1 is elevated by approximately 7.4-fold and that of the entrance-side negative lens L2-1 of the second lens group LG2 is elevated by approximately 5.4-fold in comparison with the entrance surface. By choosing radiation-resistant calcium fluoride as lens material, the lenses nevertheless remain below the material-specific loading limit.

Table G summarizes the essential data of the three exemplary embodiments in a clear overview.

TABLE G

|  | FIG. 5 | FIG. 21 | FIG. 23 |
|---|---|---|---|
| f FOS (Focal length F optical system) | 25 000 | 10 000 | 50 000 |
| Loading [mJ/cm²] CaF2 |  |  |  |
| Loading [mJ/cm²] SiO2 |  |  |  |
| L(Structural length) | 1750 | 1617.4 | 2313.3 |
| dG (Distance LG1-LG2) | 1254 | 1180 | 1516 |
| dG/fFOS | 0.05016 | 0.118 | 0.03032 |
| L/fFOS (= TF) | 0.07 | 0.1617 | 0.046266 |
| dG/L | 0.71657143 | 0.72974644 | 0.65534086 |
| Telecentricity | Telecentric | Telecentric | Telecentric |
| LLW | 0.0324 | 0.0324 | 0.0324 |
| Type | pnnp | pnpp | pnnp |
| Aspherical surfaces | 0 | 1 | 3 |
| Lenses | 5 | 6 | 4 |
| Material | CaF2 | SiO2 + CaF2 | CaF2 |

What is claimed is:

1. An illumination system configured to illuminate an illumination field, the illumination system comprising:
a variably adjustable pupil shaping unit configured to receive light and to generate a variably adjustable two-dimensional intensity distribution in a pupil shaping surface of the illumination system,
wherein:
the pupil shaping unit comprises a Fourier optical system configured to convert an entrance beam bundle entering through an entrance plane of the Fourier optical system into an exit beam bundle exiting from an exit plane of the Fourier optical system;
the Fourier optical system has a focal length $f_{FOS}$;
the Fourier optical system has a structural length L between an entrance-side first system surface and an exit-side last system surface along an optical axis;
$(L/f_{FOS}) < 1/6$; and
the illumination system is configured to be used in a microlithography projection exposure apparatus.

2. The illumination system as claimed in claim 1, wherein $(L/f_{FOS}) < 0.1$.

3. The illumination system as claimed in claim 1, wherein $f_{FOS}$ is 10 m or more, and L is less than 4 m.

4. The illumination system as claimed in claim 1, wherein:
the Fourier optical system is configured to be used with a geometrical flux of 0.01 mm $\leq$ H $\leq$ 0.2 mm; and
H is a product of a radius of an entrance pupil, an entrance-side numerical aperture $NA_O$, and an entrance-side refractive index $n_o$.

5. The illumination system as claimed in claim 1, wherein the Fourier optical system has four, five or six lenses.

6. The illumination system as claimed in claim 1, wherein the Fourier optical system comprises at least one lens having at least one aspherically shaped lens surface.

7. The illumination system as claimed in claim 1, wherein an exit-side lens surface of the Fourier optical system that is closest to the exit plane has an aspherical shape.

8. The illumination system as claimed in claim 1, wherein the Fourier optical system is telecentric on an input side and on an output side.

9. The illumination system as claimed in claim 1, wherein the Fourier optical system comprises at least one plane deflection mirror.

10. The illumination system as claimed in claim 1, wherein the Fourier optical system is folded in Z-shaped fashion.

11. The illumination system as claimed in claim 1, wherein:
the Fourier optical system comprises at least one pair of crossed cylindrical lens systems;
the at least one pair of crossed cylindrical lens systems comprises:
a first cylindrical lens system comprising at least one first cylindrical surface curved in a first curvature plane; and
a second cylindrical lens system having at least one second cylindrical surface curved in a second curvature surface; and
the first and second curvatures plane are perpendicular to each other.

12. The illumination system as claimed in claim 11, wherein the Fourier optical system comprises:
a first cylindrical lens group comprising a plurality of cylindrical lenses; and disposed downstream, a second cylindrical lens group comprising a plurality of cylindrical lenses.

13. The illumination system as claimed in claim 1, wherein the pupil shaping unit comprises a light mixing device disposed upstream of the Fourier optical system.

14. The illumination system as claimed in claim 13, wherein the light mixing device comprises a fly's eye condenser.

15. The illumination system as claimed in claim 1, wherein:
the pupil shaping unit comprises a light modulation device configured to controllably alter an angle distribution of a light bundle incident on the light modulation device; and
the Fourier optical system is arranged between a primary light source and the light modulation device.

16. The illumination system as claimed in claim 15, wherein the light modulation device comprises a two-dimensional array of individually drivable individual elements which can be used to alter the angle distribution of the impinging radiation.

17. The illumination system as claimed in claim 15, wherein the light modulation device comprises a multimirror array comprising a plurality of individually drivable individual mirrors.

18. An apparatus, comprising:
an illumination system as claimed in claim 1; and
a projection objective,
wherein the apparatus is a microlithography projection exposure apparatus.

19. An illumination system configured to illuminate an illumination field, the illumination system comprising:
a variably adjustable pupil shaping unit configured to receive light and to generate a variably adjustable two-dimensional intensity distribution in a pupil shaping surface of the illumination system,
wherein:
the pupil shaping unit comprises a Fourier optical system configured to convert an entrance beam bundle entering through an entrance plane of the Fourier optical system into an exit beam bundle exiting from an exit plane of the Fourier optical system;
the Fourier optical system has a focal length $f_{FOS}$;
the Fourier optical system has a structural length L between an entrance-side first system surface and an exit-side last system surface along an optical axis;
$(L/f_{FOS})<1/6$; and
the illumination system is configured to be used in a microlithography projection exposure apparatus;
the Fourier optical system comprises:
a first lens group; and
a second lens group disposed downstream of the first lens group,
the first lens group has an entrance-side first lens and an exit-side second lens;
the second lens group has an entrance-side first lens and an exit-side second lens; and
there is a group distance $d_G$ between an exit-side last system surface of the first lens group and an entrance-side first system surface of the second lens group.

20. An apparatus, comprising:
an illumination system as claimed in claim 19; and
a projection objective,
wherein the apparatus is a microlithography projection exposure apparatus.

21. The illumination system as claimed in claim 20, wherein $d_G$ is between $d_G^{min}$ and $(3*d_G^{min})$.

22. The illumination system as claimed in claim 19, wherein $d_G>(0.6*L)$.

23. The illumination system as claimed in claim 19, wherein $d_G<(0.12*f_{FOS})$.

24. The illumination system as claimed in claim 19, wherein the entrance-side first lens group comprises precisely two lenses.

25. An illumination system configured to illuminate an illumination field, the illumination system comprising:
a variably adjustable pupil shaping unit configured to receive light and to generate a variably adjustable two-dimensional intensity distribution in a pupil shaping surface of the illumination system,
wherein:
the pupil shaping unit comprises a Fourier optical system configured to convert an entrance beam bundle entering through an entrance plane of the Fourier optical system into an exit beam bundle exiting from an exit plane of the Fourier optical system;
the Fourier optical system has a focal length $f_{FOS}$;
the Fourier optical system has a structural length L between an entrance-side first system surface and an exit-side last system surface along an optical axis;
$(L/f_{FOS})<1/6$;
the Fourier optical system is configured to transfer a radiation energy E per unit time given a geometrical flux H;
$P_A$ is a predeterminable maximum energetic loading of an exit-side second lens of the first lens group;
$P_B$ is a predeterminable maximum energetic loading of the entrance-side first lens of the second lens group;
a group distance $d_G$ between an exit-side last system surface of the first lens group and an entrance-side first system surface of the second lens group is not less than a minimum group distance $d_G^{min}$;
$d_G^{min}$n/H*E/$(P_a P_b)^{1/2}$; and
the illumination system is configured to be used in a microlithography projection exposure apparatus.

26. An apparatus, comprising:
an illumination system as claimed in claim 25; and
a projection objective,
wherein the apparatus is a microlithography projection exposure apparatus.

* * * * *

UNITED STATES PATENT AND TRADEMARK OFFICE
CERTIFICATE OF CORRECTION

PATENT NO. : 8,537,335 B2
APPLICATION NO. : 12/917956
DATED : September 17, 2013
INVENTOR(S) : Markus Schwab et al.

It is certified that error appears in the above-identified patent and that said Letters Patent is hereby corrected as shown below:

In the Specification

Column 8, Line 28, delete "pnnp." insert --pnnp;--;

Column 8, Line 35, delete "direction." insert --direction;--;

Column 8, Line 36, delete "system." insert --system;--;

Column 8, Line 38, delete "information." insert --information;--;

Column 8, Line 39, delete "system." insert --system; and--;

Column 18, Line 57, delete "[m]" insert --[mm]--;

Column 20, Line 28, delete "[W/m$^2$)" insert --(W/m$^2$)--;

In the Claims

Column 32, Line 47, Claim 25 delete "$d_G^{min}$ n/H *E / $(P_aP_b)^{1/2}$" insert --$d_G^{min}$ = n/H *E / $(P_aP_b)^{1/2}$;--.

Signed and Sealed this
Twenty-fourth Day of December, 2013

Margaret A. Focarino
*Commissioner for Patents of the United States Patent and Trademark Office*